United States Patent
Katoh et al.

(12)

(10) Patent No.: US 6,288,957 B1
(45) Date of Patent: Sep. 11, 2001

(54) SEMICONDUCTOR MEMORY DEVICE HAVING TEST MODE AND METHOD FOR TESTING SEMICONDUCTOR THEREWITH

(75) Inventors: Tetsuo Katoh; Kiyohiro Furutani; Mitsutomi Yamashita, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/556,027

(22) Filed: Apr. 20, 2000

(30) Foreign Application Priority Data

Aug. 31, 1999 (JP) .................................... 11-245266

(51) Int. Cl.⁷ ........................................ G11C 7/00
(52) U.S. Cl. ................. 365/201; 365/63; 365/51
(58) Field of Search ................. 365/201, 63, 51, 365/230.01

(56) References Cited

U.S. PATENT DOCUMENTS 5,956,281 * 9/1999 Nakai et al. ..................... 365/201
6,041,022 * 3/2000 Maejima ............................ 365/201

FOREIGN PATENT DOCUMENTS

| 58-56286 | 4/1983 | (JP) . |
| 1-286200 | 11/1989 | (JP) . |
| 2-3145 | 1/1990 | (JP) . |
| 6-119780 | 4/1994 | (JP) . |

* cited by examiner

*Primary Examiner*—Vu A. Le
(74) *Attorney, Agent, or Firm*—McDermott, Will & Emery

(57) ABSTRACT

In an SDRAM chip, two signal generation circuits are provided corresponding to two test circuits arranged at either ends of a rectangular semiconductor substrate. Each signal generation circuit is provided in the proximity of corresponding test circuit. Hence, a signal line for test signal can be reduced and smaller chip area can be achieved compared with the conventional case where one signal generation circuit is provided at a center of the semiconductor substrate and a test signal is supplied to two test circuits from the signal generation circuit.

3 Claims, 20 Drawing Sheets

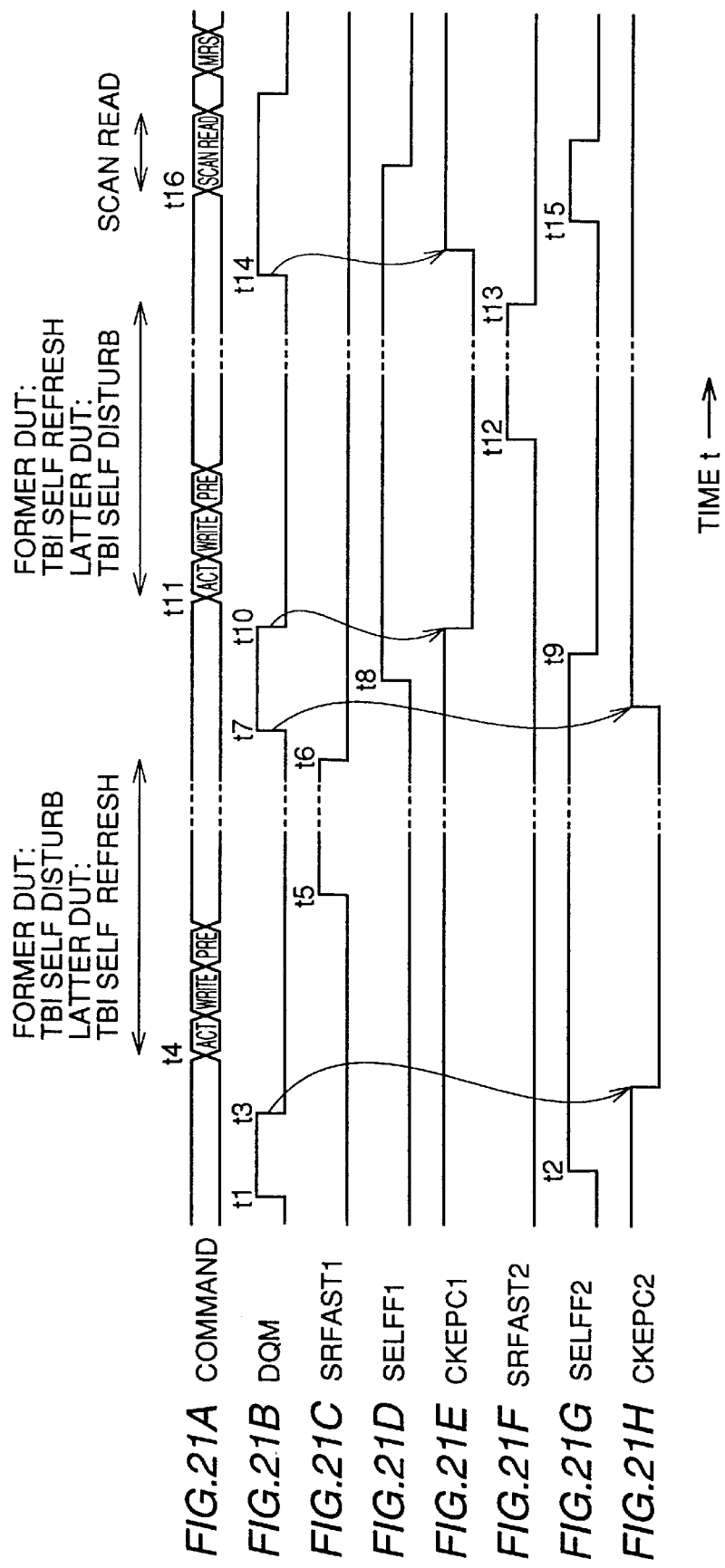

SEMICONDUCTOR MEMORY DEVICE HAVING TEST MODE AND METHOD FOR TESTING SEMICONDUCTOR THEREWITH

BACKGROUND OF THE INVENTION

1. Field of the Invention

The present invention relates to semiconductor memory devices and method for testing a semiconductor therewith, and more particularly to a semiconductor memory device having a test mode and a method for testing a semiconductor therewith.

2. Description of the Background Art

In recent years, integration of a DRAM has been quadrupled every new generation. The higher integration in DRAM means longer test time. Hence, various techniques for reducing test cost by shortening the test time has been proposed.

One technique for reducing the test cost is a so-called burn-in test. In the burn-in test, a number of DRAMs are placed on a single test board and driven under the conditions of high temperature and high power supply voltage to accelerate the occurrence of initial failure. With this technique, the test cost of one DRAM can be reduced because a number of DRAMs are tested together.

Conventionally, however, as a new test board has to be manufactured along with the progress in DRAM generation, the test cost tends to increase. In addition, lately other tests are also required to be performed during the burn-in test, and a test-facilitating design (such as test mode) has been proposed to meet the need.

Further, in order to reduce chip area, shrinkage of layout area of test-related circuitry is needed as well as of other peripheral circuitry.

SUMMARY OF THE INVENTION

Therefore, one object of the present invention is to provide a semiconductor memory device and a method for testing a semiconductor allowing reduction in test cost.

Further, another object of the present invention is to provide a semiconductor memory device with a small chip area.

According to one aspect of the present invention, a plurality of signal generation circuits are provided corresponding to a plurality of test circuits dispersedly formed on a semiconductor substrate. Each signal generation circuit is placed in the proximity of the corresponding test circuit. Thus, a signal transmission line for a test signal can be reduced to shrink the chip area, compared with the conventional case where a test signal is supplied to each test circuit from the signal generation circuit arranged in the center of the semiconductor substrate.

According to another aspect of the present invention, a semiconductor memory device which can be selectively set to one of a plurality of specs includes a signal generation circuit supplying a test mode entry signal as an output in response to supply of a higher voltage than a power supply voltage to N (1≦N≦M−1) signal input terminals predetermined according to the set spec among first to Mth signal input terminals. As a combination of signal input terminals receiving a high voltage for test mode entry is different from chip to chip according to its spec, chips with different specs can be readily distinguished. Thus, an occurrence of trouble during the test process can be prevented and the reduction in test cost can be achieved.

According to still another aspect of the present invention, in a case where a semiconductor memory device receiving first to Mth address signals and a semiconductor memory device receiving first to Nth (N>M) address signals are manufactured according to same process rule, the semiconductor memory device receiving first to Nth address signals is provided with a signal generation circuit provided corresponding to each test mode and supplying a test signal in response to an input of an m (1≦m≦M) address signals predetermined according to the corresponding test mode among first to Mth address signals. Thus, the same signal generation circuit can be shared between the semiconductor memory device receiving first to Mth address signals and the semiconductor memory device receiving first to Nth address signals, resulting in more efficient design. In addition, as the number of lines used for address signals can be reduced compared with a case where a test signal is generated based on first to Nth address signals, reduction in chip area can be achieved.

According to a still further aspect of the present invention, a signal generation circuit selectively generating a signal of a first or a second logical level during test mode and a switching circuit supplying the signal of the first or the second logical level generated by the signal generation circuit instead of a most significant bit address signal of a plurality of address signals to a select circuit at the time of test mode are provided. Thus, even when the semiconductor memory device is placed on a test board without a line for the most significant bit address signal, a desired test can be performed through the generation of the signal of first or second logical level in the semiconductor memory device. Therefore, the existing test board can be employed and the test cost can be reduced.

According to a still further aspect of the present invention, a switching circuit supplying a first clock signal generated by a clock generation circuit to a refresh counter during test mode and supplying a second clock signal generated by a variable frequency-dividing circuit to the refresh counter during other time period is provided. Hence, a self refresh can be performed even when a frequency-dividing ratio of the variable frequency-dividing circuit has not been set. Then, a number of semiconductor memory devices can be arranged like a matrix on a single test board, data can be written to all semiconductor memory devices simultaneously and a test to read data from semiconductor memory devices row by row can be easily performed. Hence, an existing test board can be utilized and the test cost can be reduced.

According to a still further aspect of the present invention, a counter with a count value incremented in response to designation of auto refresh operation designating one word line among a plurality of word lines according to the count value, and a control circuit suspending the increment of the counter during test mode are provided. Thus, as one word line can be selected once with the input of auto refresh command, a disturb test can be performed more rapidly compared with a conventional case where three command inputs, that is, active, write (read) and precharge, are required for a selection of one word line. The present invention is particularly effective when a number of semiconductor memory devices are placed on one test board for test where heavy load is applied on a tester and command input cannot be performed rapidly. Thus, an existing test board can be utilized and the reduction in test cost can be achieved.

According to a still further aspect of the present invention, provided is a control circuit prohibiting inputs of control signals other than a control signal of a first logical level when a predetermined control signal among a plurality of control signals is set to the first logical level, and permitting inputs of the plurality of control signals when the predetermined control signal is set to a second logical level during the self refresh operation. Thus, when an excessive current is consumed at the simultaneous test of a number of semiconductor memory devices placed on a single test board, a desired test can be performed for a part of the semiconductor memory devices while self refresh is performed for the rest of the semiconductor memory devices. Hence, an existing test board can be utilized and the reduction in test cost can be achieved.

According to a still further aspect of the present invention, when a number of semiconductor memory devices are placed on a single test board and tested, each semiconductor memory device is provided with a control circuit prohibiting inputs of control signals other than a control signal of a first logical level when a predetermined control signal among a plurality of control signals is set to the first logical level, and permitting input of the plurality of control signals when the predetermined control signal is set to a second logical level during the self refresh operation. Then, a predetermined number of semiconductor memory devices among the plurality of semiconductor memory devices are selected, the predetermined control signal for all semiconductor memory devices is set to the second logical level, a self refresh operation of each selected semiconductor memory device is designated and the predetermined control signal for all semiconductor memory devices is set to the first logical level, and a signal for performing a desired test is supplied to all semiconductor memory devices. Thus, when an excessive current is consumed at the simultaneous test of a number of semiconductor memory devices placed on a single test board, a desired test can be performed for a part of the semiconductor memory devices while self refresh is performed for the rest of the semiconductor memory devices, whereby reduction of power consumption can be achieved. Hence, an existing test board can be utilized and the reduction in test cost can be achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 21A to 21H are time charts shown to describe a test to be described with reference to FIGS. 19 and 20.

DESCRIPTION OF THE PREFERRED EMBODIMENTS

First Embodiment

Figure 1:
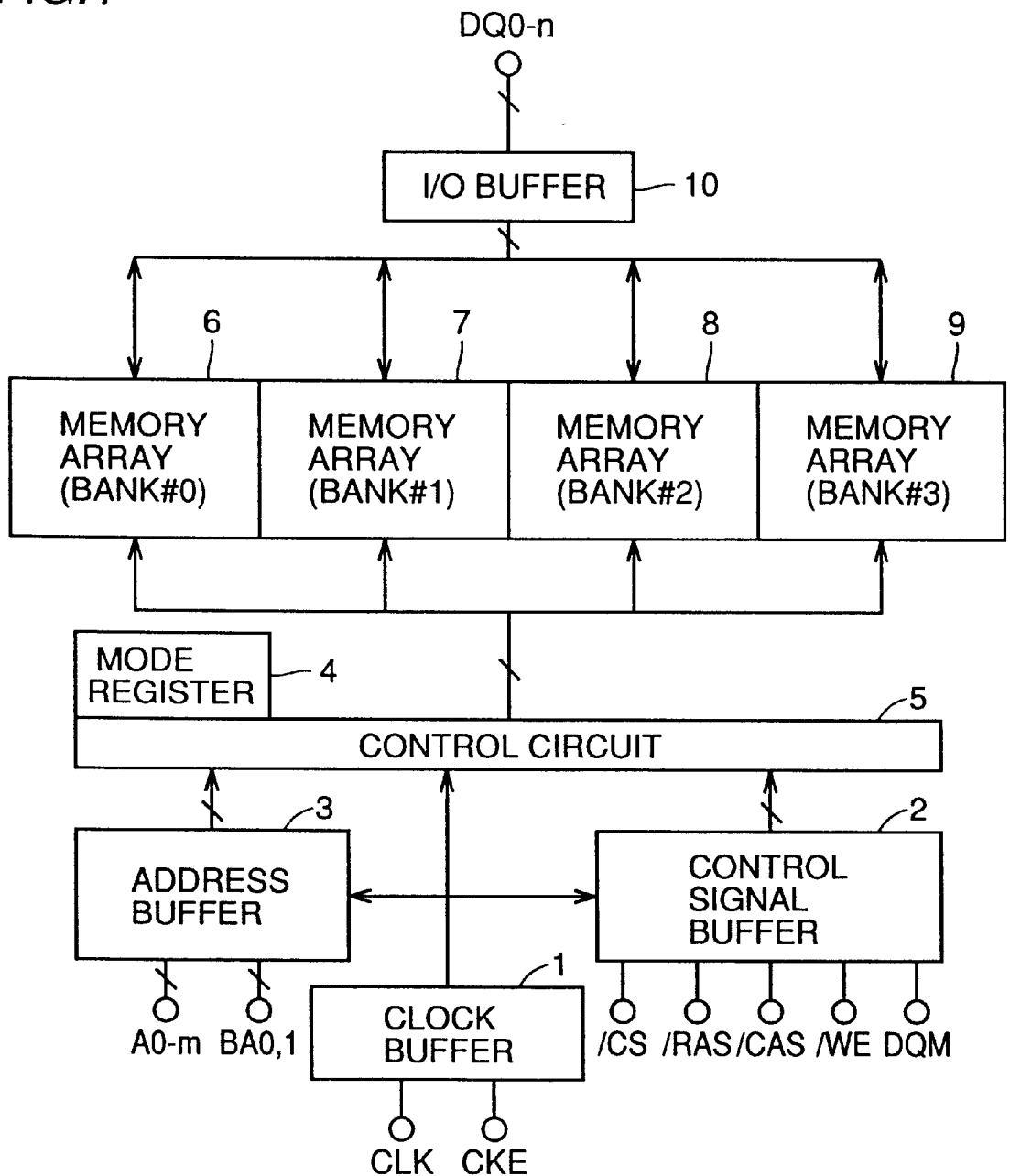
FIG. 1 is a block diagram showing a schematic structure of an SDRAM according to a first embodiment of the present invention.

FIG. 1 is a block diagram showing a schematic structure of a synchronous DRAM (hereinafter referred to as SDRAM) according to the first embodiment of the present invention. In FIG. 1, the SDRAM includes a clock buffer 1, a control signal buffer 2, an address buffer 3, a mode register 4, a control circuit 5, four memory arrays 6–9 (banks #0-#3) and an I/O buffer 10.

Clock buffer 1 is activated by an external control signal CKE and sends an external clock signal CLK to control signal buffer 2, address buffer 3 and control circuit 5. Control signal buffer 2 latches external control signals /CS, /RAS, /CAS, /WE, and DQM in synchronization with external clock signal CLK and supplies them to control circuit 5. Address buffer 3 latches external address signals A0–Am (here, m is an integer at least 0) and bank select signals BA0 and BA1 in synchronization with external clock signal CLK from clock buffer 1 and supplied them to control circuit 5.

Mode register 4 stores a mode designated by external address signals A0–Am or the like and outputs an internal command signal corresponding to the mode. Memory arrays 6–9 each include a plurality of memory cells arranged like a matrix each storing one-bit data. The plurality of memory cells are divided into groups of n+1 cells each in advance (here, n is an integer at least 0).

Control circuit 5 generates various internal signals according to signals from clock buffer 1, control signal buffer 2, address buffer 3 and mode register 4 and controls the SDRAM as a whole. In writing and reading operations, control circuit 5 selects one memory array from four memory arrays 6–9 according to bank select signals BA0 and BA1 and selects n+1 memory cells from memory cells therein according to address signals A0–Am. The selected n+1 memory cells are activated and coupled to I/O buffer 10.

In the writing operation, I/O buffer 10 supplies data D0–Dn supplied from an external source to the selected n+1 memory cells, and in the reading operation outputs read data Q0–Qn from n+1 memory cells.

Figure 2:
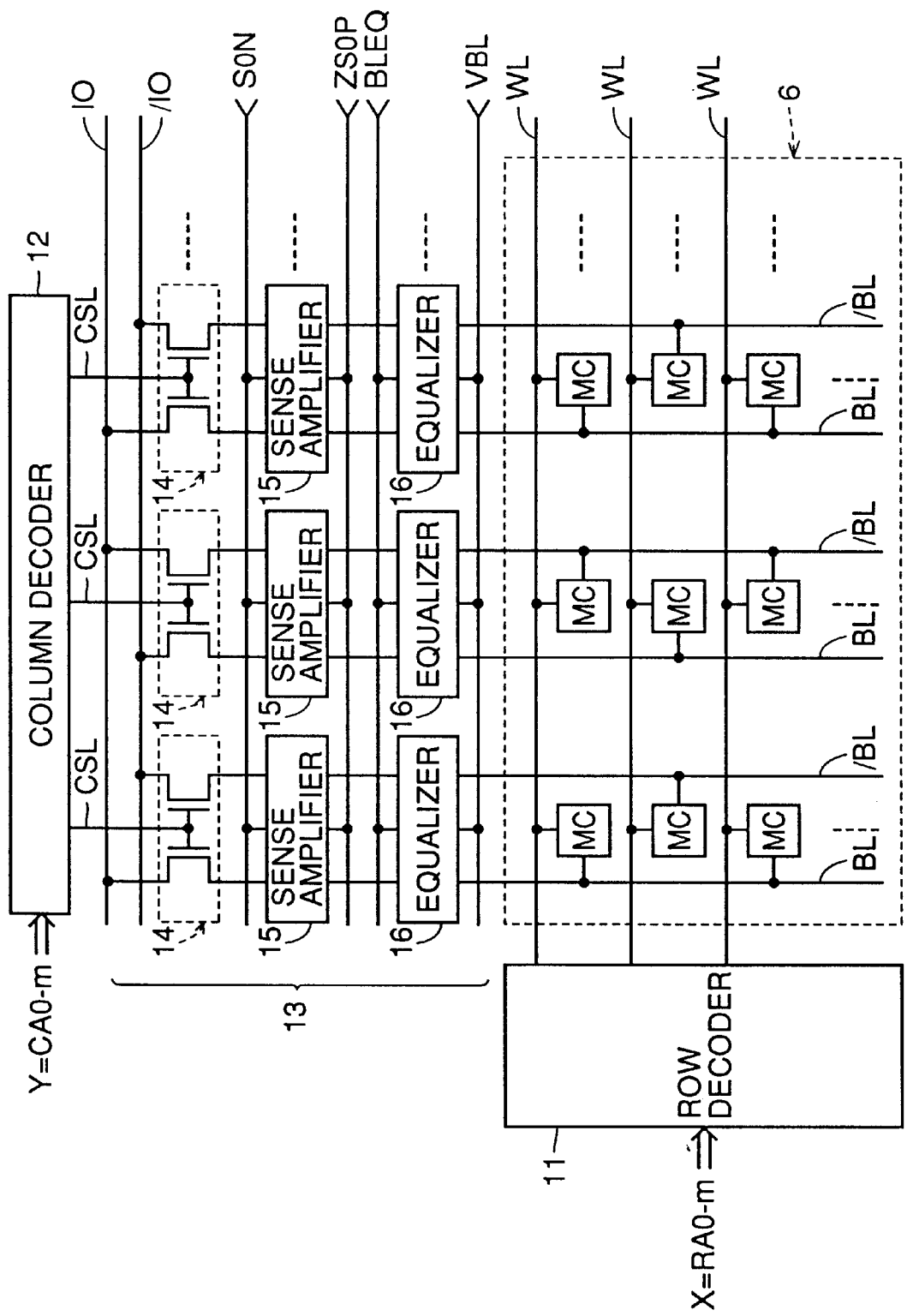
FIG. 2 is a circuit block diagram showing a structure of a part of a memory array shown in FIG. 1 and an associated portion thereof.
Figure 3:
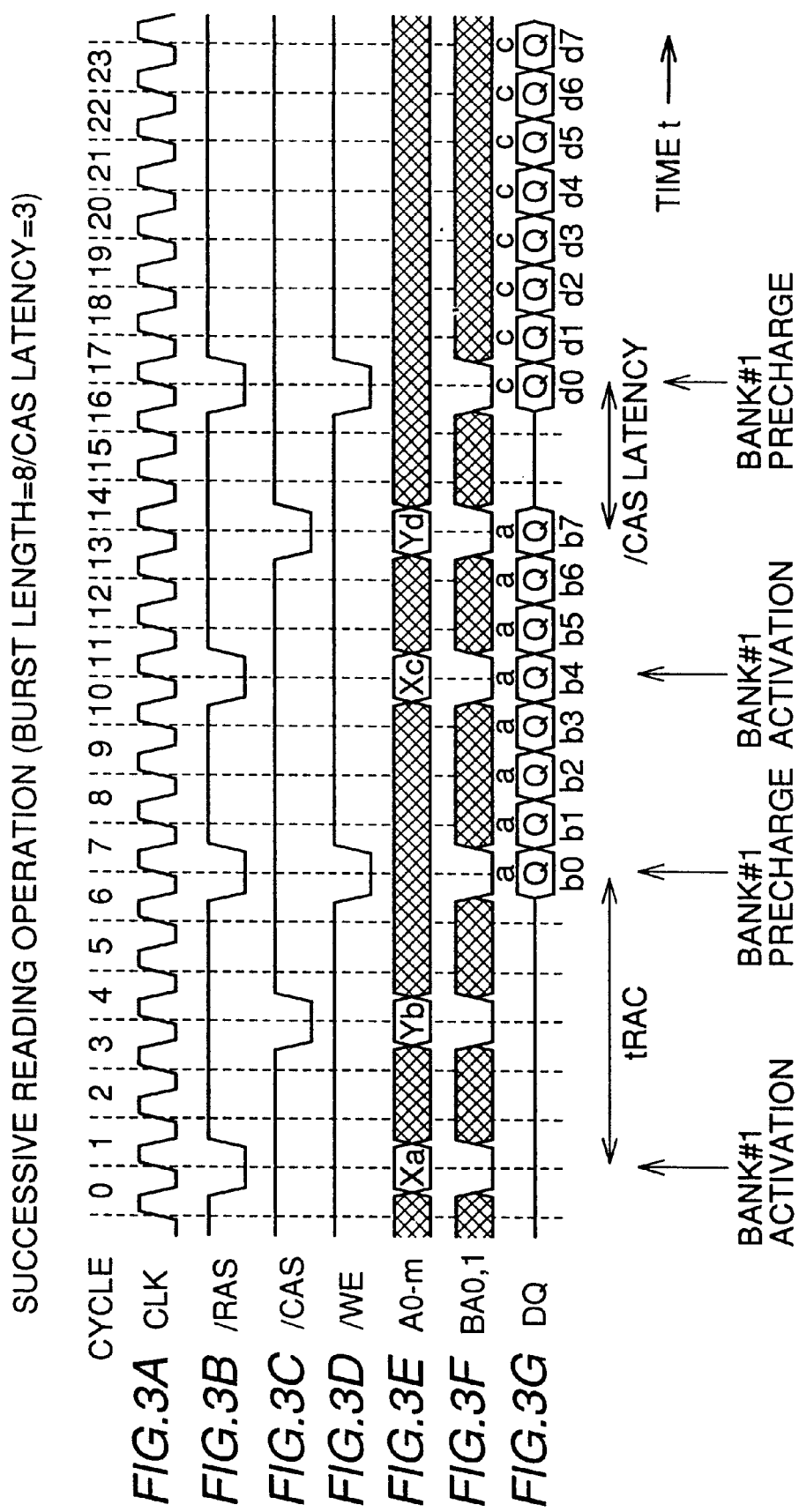
FIGS. 3A to 3G are time charts showing a successive reading operation of an SDRAM shown in FIG. 1.
Figure 4:
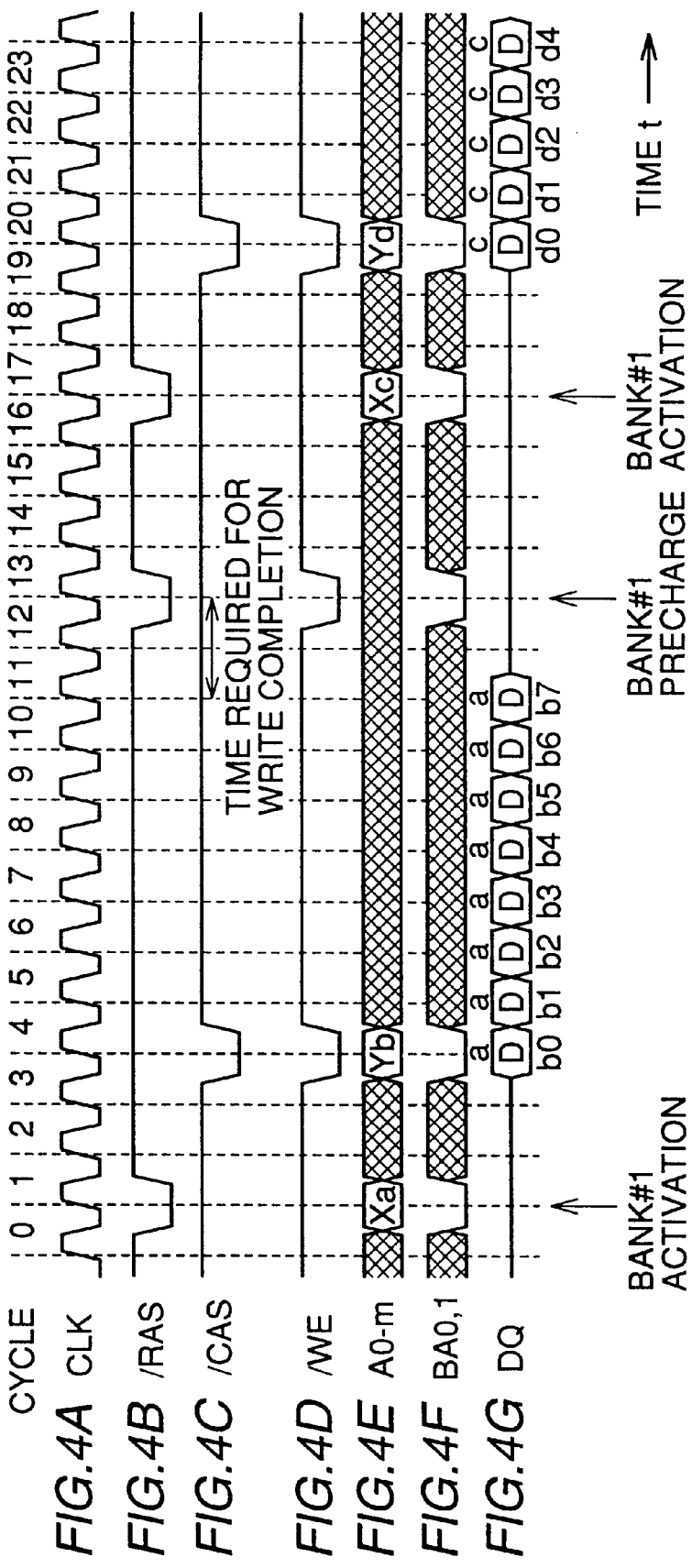
FIGS. 4A to 4G are time charts showing a successive writing operation of an SDRAM shown in FIG. 1.

FIG. 2 is a circuit block diagram showing a structure of a part of memory array 6 shown in FIG. 1 and an associated portion thereof. In FIG. 2, memory array 6 includes a plurality of memory cells MCs arranged like a matrix, a word line WL provided corresponding to each row, and a bit line pair BL, /BL provided corresponding to each column. Memory cell MC is well known in the art and includes an access transistor and a capacitor for storing information.

Corresponding to memory array 6, a row decoder 11, a column decoder 12 and a sense amplifier+input/output control circuit 13 are provided. Sense amplifier+input/output control circuit 13 includes a data input/output line pair IO, /IO, a column select gate 14 arranged corresponding to each column of memory array 6, a sense amplifier 15 and an equalizer 16.

Column select gate 14 includes a pair of N channel MOS transistors connected between bit line pair BL, /BL of a corresponding column and data input/output line pair IO, /IO. A gate of each N channel MOS transistor is connected to column decoder 12 via a column select line CSL of a corresponding column. When column select line CSL is raised to an "H (logical high)" level, which is a select level, by column decoder 12, N channel MOS transistor is rendered conductive and bit line pair BL, /BL and data input/output line pair IO, /IO are coupled.

Sense amplifier 15 amplifies a minute potential difference between bit lines BL and/BL up to a power supply voltage VCC in response to rise and fall of sense amplifier activation signals S0N and ZS0P, respectively to an "H" level and an "L Gogical low)" level. Equalizer 16 equalizes the potentials of bit lines BL and/BL to a bit line potential VBL in response to the rise of a bit line equalize signal BLEQ to an activation level, that is, "H" level.

Row decoder 11 raises the level of one word line WL among the plurality of word lines WLs to a select level of "H" according to row address signals RA0–RAm. Column decoder 12 raises one column select line CSL among the plurality of column select lines CSLs to a select level of "H" according to column address signals CA0–CAm.

FIGS. 3A to 3G are time charts showing states of external signals at the successive reading operation of 8-bit data in such SDRAM. Here, bit number of data to be read or written in series is called a burst length, and the bust length can be changed by mode register 4 in the SDRAM.

In the SDRAM, external control signals/CS, /RAS, and so on and address signals A0–Am are taken in at the rising edge of clock signal CLK, which is a system clock supplied from an external source, for example. Address signals A0–Am include row address signals X=RA0–RAm and column address signals Y=CA0–CAm multiplexed in a time-divisional manner. At the rising edge of clock signal CLK in cycle 1, an active command (/CS=L, /RAS=L, /CAS=H, and /WE=H) is input, and address signals RAM0–RAm at this time are taken in as a row address signal Xa.

Then, in response thereto, bit line equalize signal BLEQ falls to an inactivation level, that is, an "L" level and the equalization of bit lines BL and/BL is suspended with the inactivation of equalizer 16. Row decoder 11 raises the level of a word line WL of a row corresponding to row address signal Xa to a select level, that is, an "H" level. The potentials of bit lines BL and/BL change by a minute amount corresponding to an amount of charge of a capacitor in an activated memory cell MC. Then, sense amplifier activation signals S0N and ZS0P are turned to an "H" level and "L" level, respectively, and sense amplifier 15 is activated.

When the potential of bit line BL is higher than the potential of bit line/BL by a minute amount, the potential of bit line BL is pulled up to an "H" level and the potential of bit line/BL is pulled down to an "L" level. Contrarily, when the potential of bit line/BL is higher than the potential of bit line BL by a minute amount, the potential of bit line IBL is pulled up to an "H" level and the potential of bit line BL is pulled down to an "L" level.

Then in cycle 4, at a rising edge of clock signal CLK, read command (/CS=L, /RAS=H, /CAS=L and /WE=H) is given and address signals CA0–CAm at this time are taken in as a column address signal Yb. Then, column decoder 12 sequentially pulls up burst-length, that is, eight column select lines CSLs to a select level, that is, an "H" level, by a predetermined time period based on column address signal Yb, and renders column select gate 14 of each column conductive. Data in bit line pair BL, /BL of the selected column is supplied to I/O buffer 10 via column select gate 14 and data input/output line pair IO, /IO. After a predetermined clock period (six clock cycles in FIG. 3) from the fall of signal/RA to an "L" level, a first data b0 is supplied from I/O buffer. Thereafter data b1–b7 are output in response to the fall of clock signal CLK.

Then at the rising edge of clock signal CLK in cycle 7, a precharge command (/CS=L, /RAS=L, /CAS=H and/WE=L) is given. Then a word line WL is pulled down to a non-select level, that is, an "L" level in response thereto, sense amplifier 15 is inactivated, equalizer 16 is activated, bit line BL, /BL are equalized to bit line potential VBL, and thus the preparation for the next reading operation is finished.

FIGS. 4A to 4G are time charts showing states of external signals at the successive writing operation of 8-bit data in the SDRAM. In the writing operation, taking-in of row address signal X is similar to that in the data reading. At a rising edge of clock signal CLK in cycle 1, an active command (/CS=L, /RAS=L, /CAS=H, and/WE=H) is input and address signals A0–Am at this time are taken in as a row address signal Xa. In response thereto, equalizer 16 is inactivated, word line WL corresponding to row address signal Xa is pulled up to an "H" level, that is, a select level, by row decoder 11, memory cell MC is activated and sense amplifier 15 is activated. At a rising edge of clock signal CLK in cycle 4, a write command (/CS=L, /RAS=H, /CAS=L, and/WE=L) is input and column address signal Yb is taken in and data b0 being supplied at the time is taken in as first write data. Following data b0, input data b1–b7 are sequentially taken in in synchronization with clock signal CLK.

Row decoder 12 sequentially pulls up burst-length, that is, eight column select lines CSLs to an activation level, that is, an "H" level based on row address signal Yb for a predetermined time period, rendering column select gates 14 sequentially conductive. Write data b0–b7 supplied from an external source are sequentially supplied to bit line pair BL, /BL of a selected column via data input/output line pair IO, /IO. Each write data is given as a potential difference between bit lines BL and/BL. Charge with an amount corresponding to the potential of bit line BL or/BL is stored in a capacitor of a selected memory cell MC.

When writing of data b0–b7 is completed, precharge command (/CS=L, /RAS=L, /CAS=H, /WE=L) is input at a rising edge of clock signal CLK in cycle 13. Then, in response thereto, word line WL is pulled down to anon select level, that is, an "L" level, sense amplifier 15 is inactivated, equalizer 16 is activated, the potentials of bit lines BL, /BL are equalized to bit line potential VBL and the preparation for the next writing operation is completed.

In addition, when refresh command is input, equalizer 16 is inactivated, word line WL designated by the refresh counter is pulled up to a select level, that is, an "H" level to activate memory cell MC, sense amplifier 15 is activated, and re-writing of data to memory cell MC is performed. Thereafter, word line WL is pulled down to an "L" level, sense amplifier 15 is inactivated, equalizer 16 is activated, and data refresh for each memory cell MC corresponding to one word line WL is finished.

Refresh is classified into auto refresh and self refresh. In auto refresh, in response to the input of auto refresh command, the refresh counter is incremented and only one word line WL is selected. In self refresh, in response to the input of self refresh command, a clock signal of a predetermined cycle is supplied to the refresh counter and all word lines WLs are sequentially selected one by one in synchronization with the clock signal. The cycle of the refresh is set according to the data storing capability of each SDRAM.

Figure 5:
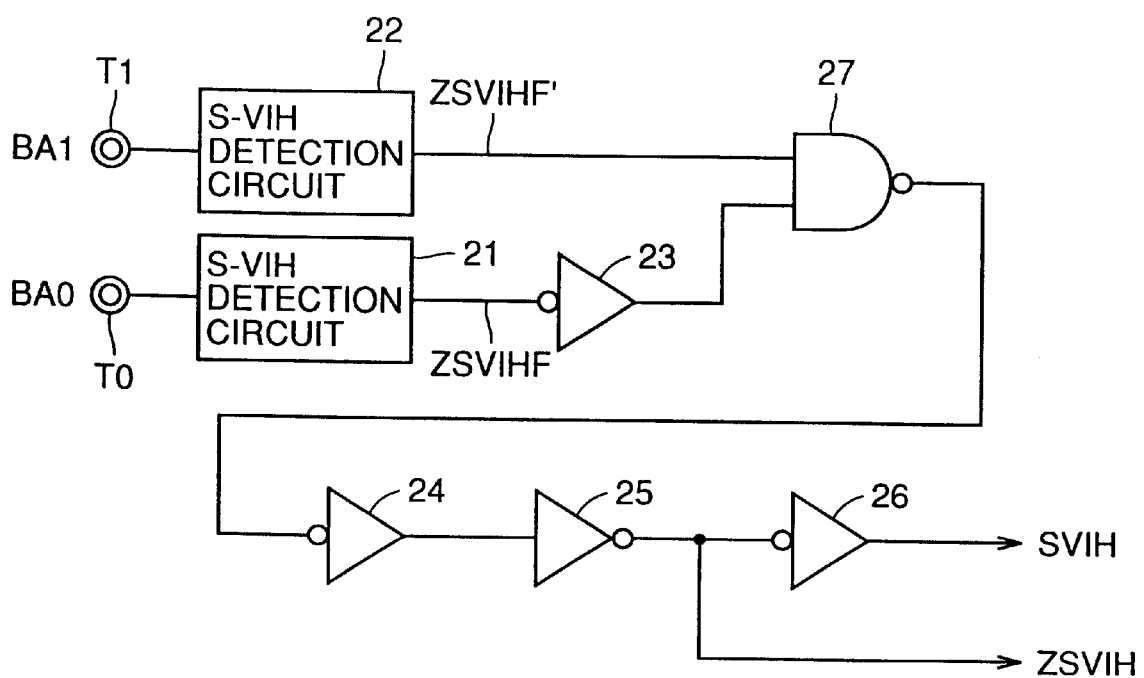
FIG. 5 is a circuit block diagram showing a structure of a test mode entry signal generation circuit included in an SDRAM shown in FIG. 1.

In such SDRAM, various tests are performed before the shipment including a test for confirming whether each memory cell MC is normal or not. Hence, a circuit for causing the SDRAM to enter the test mode is provided in the SDRAM. FIG. 5 is a circuit block diagram showing a structure of such test mode entry circuit. In FIG. 5, the test mode entry circuit includes S-VIH detection circuits 21 and 22, inverters 23–26 and an NAND gate 27.

Figure 6:
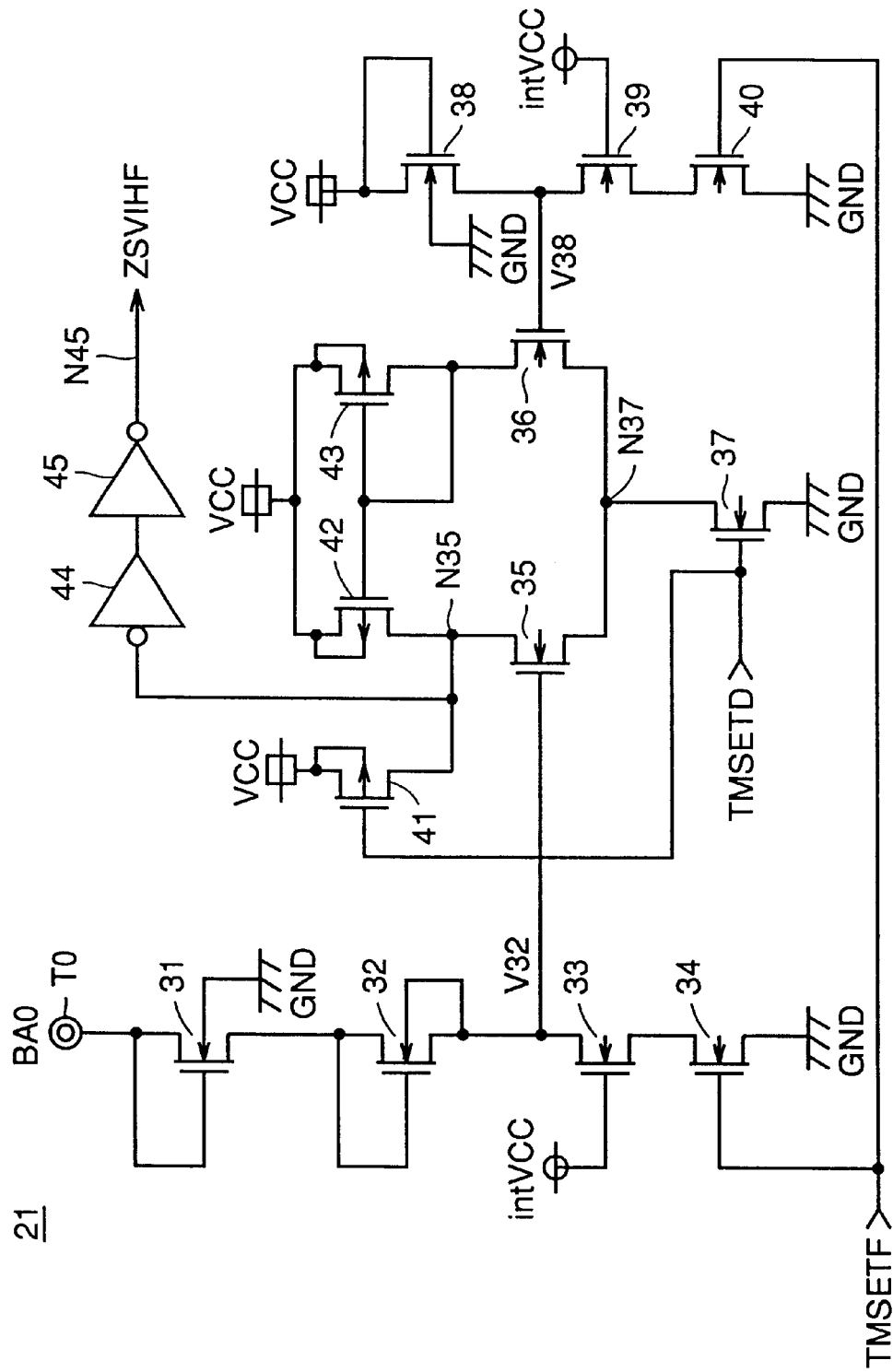
FIG. 6 is a circuit diagram showing a structure of an S-VIH detection circuit shown in FIG. 5.

As shown in FIG. 6, S-VIH detection circuit 21 includes N channel MOS transistors 31–40, P channel MOS transistors 41–43, and inverters 44 and 45. N channel MOS transistors 31–34 are connected in series between a terminal T0 for bank select signal BA0 and a line of ground potential GND. N channel MOS transistors 38–40 are connected in series between a line of external power supply potential VCC and a line of ground potential GND. N channel MOS transistors 31, 32 and 38 are each diode-connected. Gates of N channel MOS transistors 33 and 39 receive internal power supply voltage intVCC. Each of N channel MOS transistors 33 and 39 operates as a resistance element. Gates of N channel MOS transistors 34 and 40 receive a signal TMSETF.

MOS transistors 42 and 35, 43 and 36 are connected in series between a line of external power supply potential VCC and a node N37, respectively. Gates of P channel MOS transistors 42 and 43 are connected to a drain of P channel MOS transistor 43. P channel MOS transistors 42 and 43 constitute a current mirror circuit. A gate of N channel MOS transistor 35 receives a potential V32 of a node between N channel MOS transistors 32 and 33. A gate of N channel MOS transistor 36 receives a potential V38 of a node between N channel MOS transistors 38 and 39. N channel MOS transistor 37 is connected between node N 37 and a line of ground potential GND and has a gate receiving a signal TMSETD. P channel MOS transistor 41 is connected between a line of external power supply potential VCC and a drain of P channel MOS transistor 42 (node N35) and has a gate receiving signal TMSETD. Inverters 44 and 45 are connected in series between node N35 and an output node N45.

When signals TMSETF and TMSETD are at an inactivation level, that is, an "L" level, N channel MOS transistors 34, 37, 40 are rendered nonconductive, P channel MOS transistor 41 is rendered conductive, turning node N35 to an "H" level and a signal ZSVIHF to an inactivation level, that is, an "H" level.

When signals TMSETF and TMSETD are turned to an activation level, that is, an "H" level, N channel MOS transistors 34, 37, 40 are rendered conductive, P channel MOS transistor 41 is rendered nonconductive, and S-VIH detection circuit 21 is activated. When bank select signal BA0 is supplied to a terminal T0, terminal T0 is turned to an "H" level (external power supply potential VCC) or an "L" level (ground potential GND). Therefore, V38 becomes higher than V32, rendering a current flowing through MOS transistors 36, 43 and 42 higher than a current that might flow through MOS transistor 35, turning node N35 an "H" level and signal ZSVIHF an "H" level, that is, an inactivation level.

When a high voltage S-VIH higher than external power supply potential VCC by an amount higher than a threshold voltage Vth of the N channel MOS transistor is applied to terminal T0, V32 becomes higher than V38 and a current flowing through MOS transistors 36, 43 and 42 becomes lower than a current flowing through MOS transistor 35, turning node N35 an "L" level and signal ZSVIHF an "L" level, that is, an activation level. S-VIH detection circuit 22 is same with S-VIH detection circuit 21 except that it is connected to a terminal T1 for bank select signal BA1 instead of terminal T0 for bank select signal BA0.

Returning to FIG. 5, output signal ZSVIHF of S-VIH detection circuit 21 is supplied as an input to one input node of NAND gate 27 via inverter 23 and output signal ZSVIHF' of S-VIH detection circuit 22 is input to another input node of NAND gate 27. Output signal of NAND gate 27 is turned to signal SVIH delayed by inverters 24–26 and also turned to signal ZSVIH delayed by inverters 24 and 25.

When bank select signals BA0 and BA1 are supplied to terminals T0 and T1, signals ZSVIHF and ZSVIHF' both attain an "H" level and signal SVIH attains an "L" level, that is, an inactivation level. When a high voltage S-VIH is applied to both terminals T0 and T1, signals ZSVIH and ZSVIHF' both attain an "L" level and signal SVIH attains an "L" level of an inactivation level.

When bank select signal BA0 is applied to terminal T0 and high voltage S-VIH is applied to terminal T1, signals ZSVIHF and ZSVIHF' attains an "H" level and an "L" level, respectively, and signal SVIH attains an "L" level, that is, an inactivation level. When high voltage S-VIH is applied to terminal T0 and bank select signal BA1 is applied to terminal T1, signals ZSVIHF and ZSVIHF' attain an "L" level and an "H" level, respectively, and signal SVIH attains an "H" level of an activation level.

Thus, two S-VIH detection circuits 21 and 22 are provided and the entry into test mode is performed only when one S-VIH detection circuit 21 detects high voltage S-VIH. This is because when external power supply potential VCC and "H" level bank select signals BA0, BA1 are simultaneously applied, it is highly probable that the levels of bank select signals BA0 and BA1 rise faster than the external power supply potential VCC, rendering V32 in FIG. 6 higher than V38, turning signal ZSVIHF to an "L" level.

Here, when a type of the product is switched at a mask switching in aluminum process or wire bonding, that is, when products of different specs are manufactured from the same chip, the connection between terminals T0 and T1 and S-VIH detection circuits 21 and 22 are switched.

Figure 7:
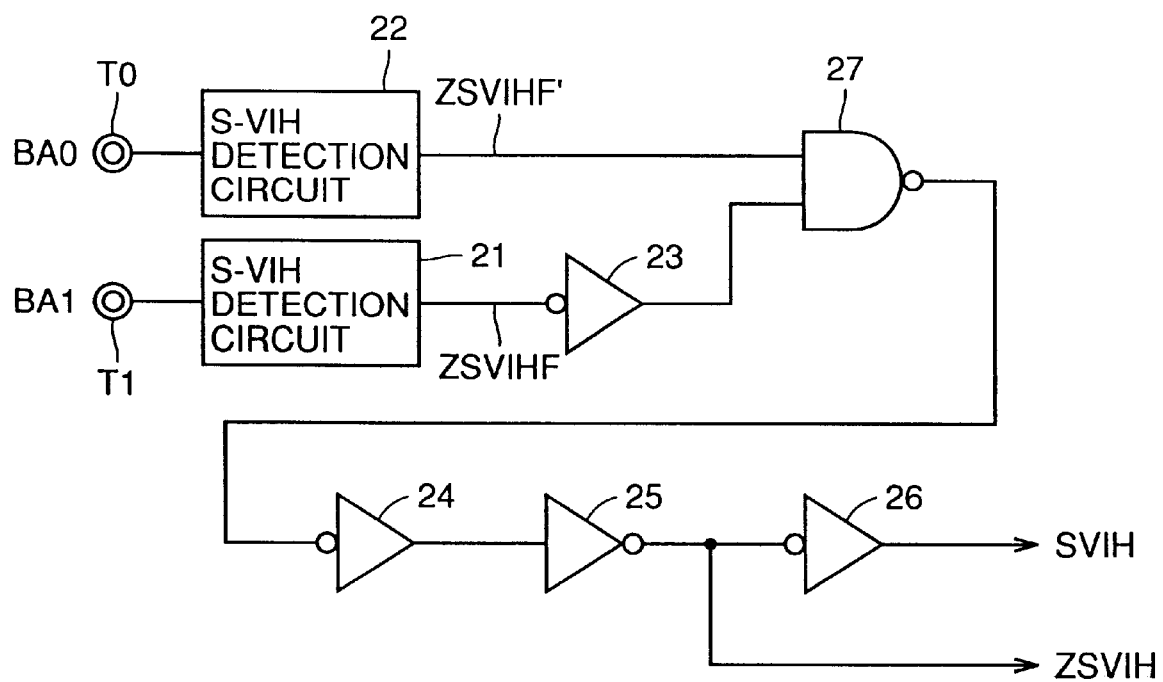
FIG. 7 is a circuit block diagram showing a structure of a test mode entry signal generation circuit included in an SDRAM with a different spec from and manufactured from the same chip with an SDRAM shown in FIGS. 1 to 6.

In a single data rate SDRAM, that is, in an SDRAM where data is input/output in synchronization with a fall of clock signal CLK, terminals T0 and T1 are connected to S-VIH detection circuits 21 and 22, respectively, as shown in FIG. 5. In a double data rate SDRAM, that is in an SDRAM where data is input/output in synchronization with fall and rise of clock signal CLK, terminals T0 and T1 are connected to S-VIH detection circuits 22 and 21, respectively, as shown in FIG. 7.

Thus, chip identification is facilitated and types of chip would not be mistaken during the test process.

Second Embodiment

Figure 8:
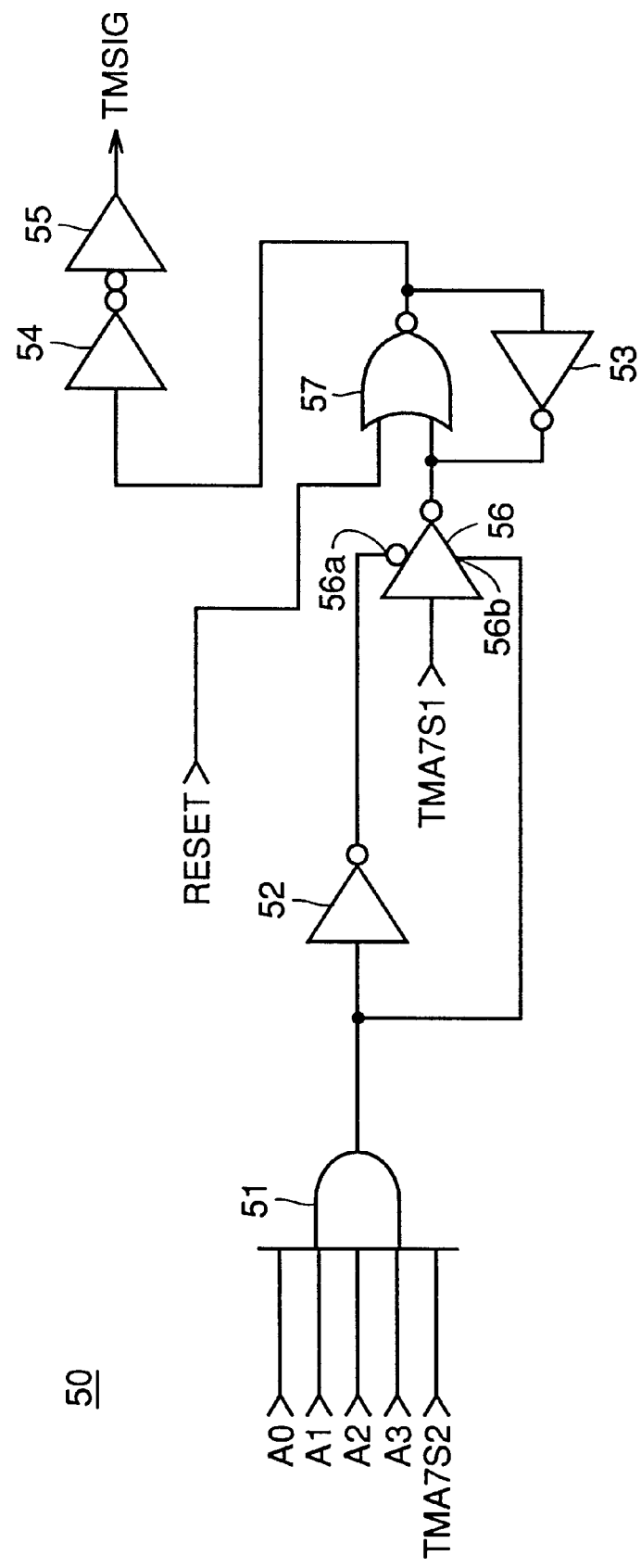
FIG. 8 is a circuit diagram showing a structure of a test signal generation circuit of an SDRAM according to a second embodiment of the present invention.
Figure 9:
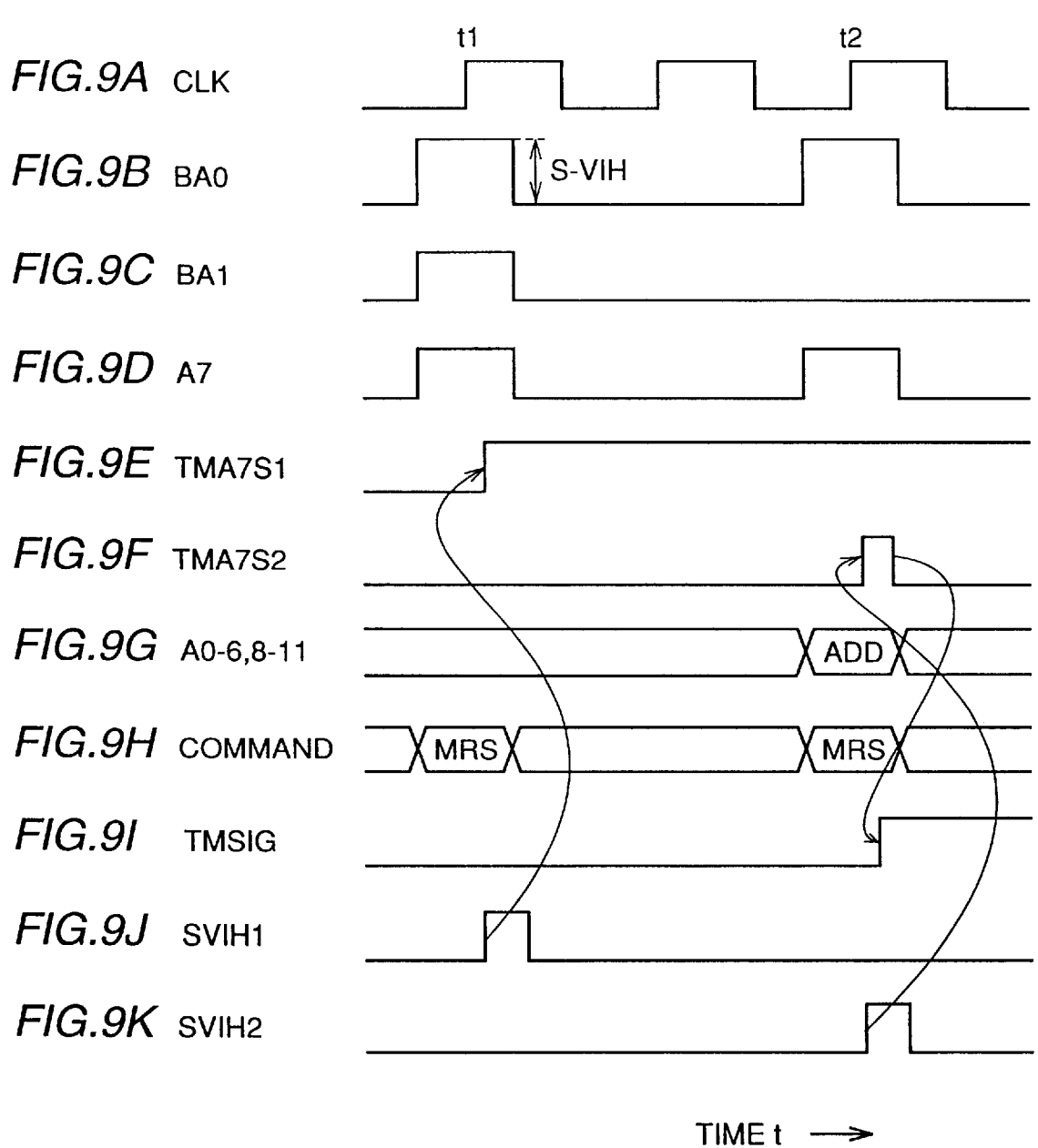
FIGS. 9A to 9K are time charts showing an operation of a test signal generation circuit shown in FIG. 8.

FIG. 8 is a circuit diagram showing a structure of a test signal generation circuit 50 of an SDRAM according to the second embodiment of the present invention. In FIG. 8, test signal generation circuit 50 includes an AND gate 51, inverters 52–55, a clocked inverter 56 and an NOR gate 57.

And gate 51 receives predetermined four signals (A0–A3 in the drawing) among address signals A0–A6, A8–A11 and a signal TMA7S2. An output of AND gate 51 is supplied to an inversion control node 56a of clocked inverter 56 via inverter 52 and in addition, directly supplied to a control node 56b of clocked inverter 56. A signal TMA7S1 is supplied to one input node of NOR gate 57 via clocked inverter 56. A signal RESET is input to another input node of NOR gate 57. Inverter 53 is connected between an output node and one input node of NOR gate 57. An output signal of NOR gate 57 is turned to a test signal TMSIG delayed by inverters 54 and 55.

FIGS. 9A to 9K are time charts shown to describe an operation of test signal generation circuit 50 shown in FIG. 8. At time t1, high voltage S-VIH is applied to terminal T0 for bank select signal BA0, and bank select signal BA1 and address signal A7 are turned to an "H" level. Then, when a mode register set command MRS (/CS=L, /RAS=L, /CAS=L, /WE=L) are input, an output signal (assumed to be SVIH1, here) of the test mode entry circuit shown in FIG. 5 attains an "H" level, and in response thereto signal TMA7S1 is turned to an "H" level, that is, an activation level.

Then, at time t2, high voltage S-VIH is applied to terminal T0 for bank select signal BA0, address signal A7 is turned to an "H" level, mode register set command MRS is input, and predetermined four address signals A0–A3 are turned to an "H" level. Then, an output signal SVIH2 of another test mode entry circuit attains an "H" level, turning signal TMA7S2 to an "H" level. Thus an output signal of AND gate 51 in FIG. 8 is turned to an "H" level and clocked inverter 56 is activated. An "L" level signal output from clocked inverter 56 is latched by a latch circuit constituted by NOR gate 57 and inverter 53. Then, test signal TMSIG attains an "H" level. When signal RESET attains an "H" level, signal TMSIG is reset to an "L" level.

Usually, a chip can be set to one of a plurality of test modes, and additionally, test signal generation circuit 50 shown in FIG. 8 of the same number with the test modes are provided. Four specific address signals selected from address signals A0–A6, A8–A11 are allocated to each of the plurality of test signal generation circuits 50.

One purpose of the test mode is to quickly and efficiently detect a failure deeply related to a device structure. Therefore, the content of test mode is nearly the same in 64-M SDRAM, 128-M SDRAM, and 256-M SDRAM developed according to the same process rule. Hence, address signals employed for generating test signal TMSIG are taken from those employed in a product with small memory capacity. In 64-M SDRAM and 128-M SDRAM, 12-bit address signals A0–A11 are employed while 13-bit address signals A0–A12 are employed in 256-M SDRAM. For the generation of test signal TMSIG, however, address signals A0–A11 are employed but not A12.

Then, as the same test signal generation circuit 50 can commonly be used among 64-M, 128-M and 256-M products, design efficiency will be enhanced. Further, the number of lines can be reduced as A12 is not employed, and chip area can be reduced.

Third Embodiment

Recently, with the advance in SDRAM integration, transistor size has shrunk. An interval between lines of aluminum or the like has not been reduced, and in the design of SDRAM the reduction of the number of lines in chip comes to a concern. In the third embodiment, this problem will be solved.

Figure 10:
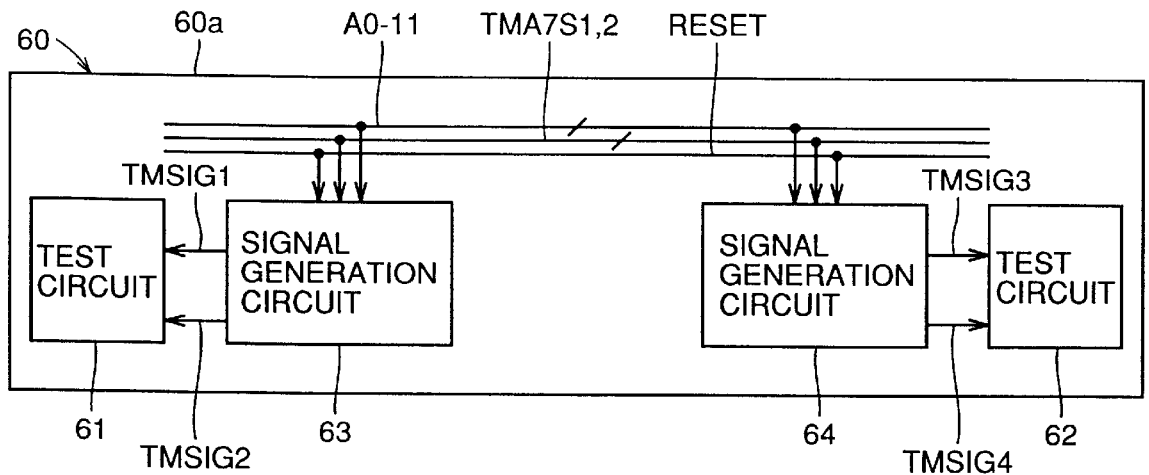
FIG. 10 is a diagram showing a layout of an SDRAM chip according to a third embodiment of the present invention.
Figure 11:
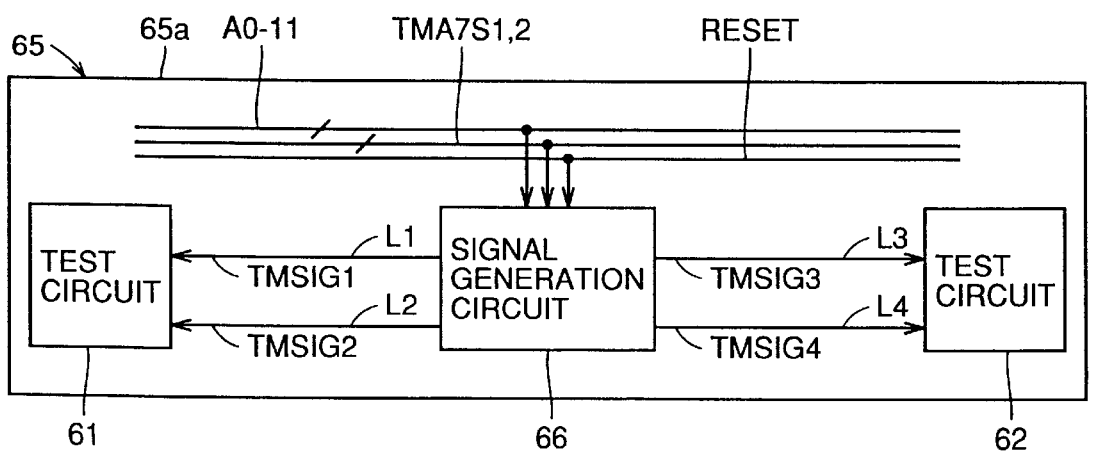
FIG. 11 is a diagram showing a comparative device of a third embodiment.

FIG. 10 is a block diagram showing a main portion of an SDRAM chip 60 according to the third embodiment of the present invention, and FIG. 11 is a block diagram showing a main portion of a conventional SDRAM chip 65 shown for comparison.

In FIG. 11, conventional SDRAM chip 65 includes a signal generation circuit 66 arranged at the center of a rectangular semiconductor substrate 65a and test circuits 61 and 62 respectively arranged at one end and another end of semiconductor substrate 65a. A group of lines for address signals A0–A11, test mode entry signals TMA7S1, TMA7S2 and signal RESET extend from one end to another end of semiconductor substrate 65a. Signal generation circuit 66 includes four sets of test signal generation circuits 50 shown in FIG. 8, for example, and outputs test signals TMSIG1–TMSIG4 in response to signals from above mentioned group of lines. Signals TMSIG1–TMSIG4 are supplied to test circuits 61–62 via lines L1–L4, respectively.

On the other hand, in SDRAM chip 60 shown in FIG. 10, signal generation circuit 66 is divided into two signal generation circuits 63 and 64 and arranged at opposite ends of a semiconductor substrate 60a. Two signal generation circuits 63 and 64 are arranged at the proximity of test circuits 61 and 62, respectively. The distance between signal generation circuit 63 and test circuit 61 is shorter than the distance between signal generation circuit 63 and a center of substrate 60. The distance between signal generation circuit 64 and test circuit 62 is shorter than the distance between signal generation circuit 64 and the center of substrate 60. Signal generation circuit 63 includes two sets of test signal generation circuit 50 shown in FIG. 8, receives signals from above mentioned group of lines, generates and supplies test signals TMSIG1, TMSIG2 to test circuit 61. Signal generation circuit 64 includes two test signal generation circuits 50 shown in FIG. 8, receives signals from above mentioned lines, and generates and supplies test signals TMSIG3 and TMSIG4 to test circuit 62. Thus, in the third embodiment, signal lines L1–L4 are reduced and chip area can be reduced.

Fourth Embodiment

Conventionally, test efficiency has been improved by adapting a technique where a number of SDRAMs are placed on a single test board, and control signals and address signals commonly are supplied to SDRAMs. Here, as 64-M SDRAM, 128-M SDRAM and 256-M SDRAM employ the same package and same number of pins, 256-M SDRAM can be set on a test board for 64-M SDRAM. In 64-M SDRAM and 128-M SDRAM, however, a pin used for address signal A12 in 256-M SDRAM is not employed. Therefore, the test board manufactured for the 64-M SDRAM is not provided with an interconnection for address signal A12. Hence, 256-M SDRAM cannot be tested with the test board for 64-M SDRAM and if a test board for 256-M SDRAM is newly manufactured, test cost will increase. In the fourth embodiment, this problem will be solved.

Figure 12:
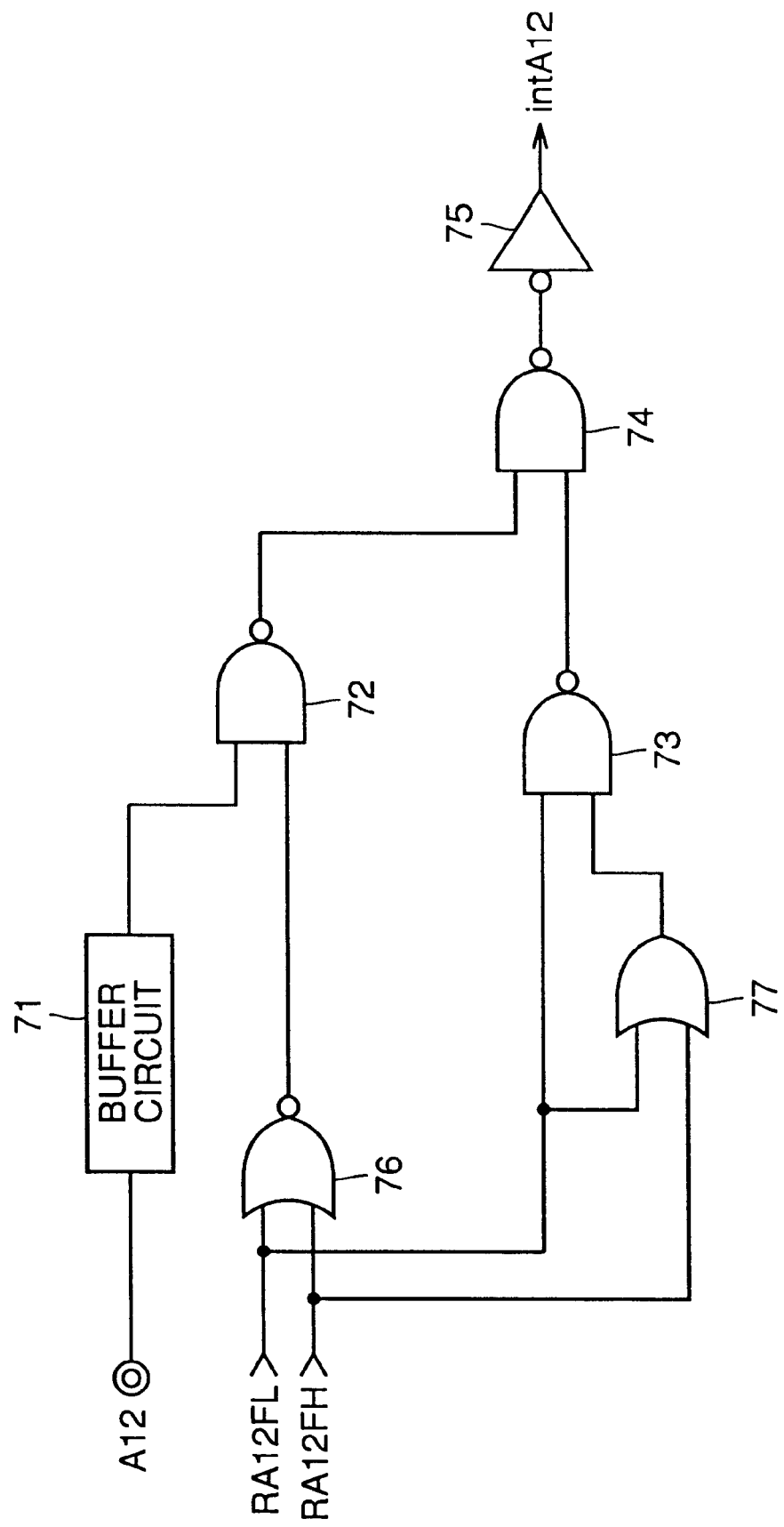
FIG. 12 is a circuit block diagram showing a main portion of an SDRAM according to a fourth embodiment of the present invention.

FIG. 12 is a circuit block diagram showing a main portion of an SDRAM according to the fourth embodiment of the present invention. In FIG. 12, the SDRAM includes a buffer circuit 71, NAND gates 72–74, an inverter 75, an NOR gate 76 and an OR gate 77.

External address signal A12 is inverted at buffer circuit 71 and supplied to one input node of NAND gate 72. NOR gate 76 and OR gate 77 both receive signals RA12FL and RA12FH. Each of signals RA12FL and RA12FH are one type of test signal TMSIG described with reference to FIG. 8. An output signal of NOR gate 76 is supplied to another input node of NAND gate 72. NAND gate 73 receives signal RA12FL and an output signal of OR gate 77. NAND gate 74 receives output signals of NAND gates 72 and 73 and the output signal thereof is inverted by inverter 75 and turned to an internal address signal intAl2.

When a test of memory region of address signal A12=0 is desired, signal RA12FL and RA12FH are turned to an "H" level and "L" level, respectively. Then, the output of NOR gate 76 is turned to an "L" level and the output of NAND gate 72 is held at an "H" level. At the same time, the output of NANTD gate 73 is turned to an "L" level and internal address signal intAl2 is turned to an "L" level (0).

When a test of memory region of address signal A12=1 is desired, signal RA12FL and RA12FH are turned to an "L" level and "H" level, respectively. Then, the output of NOR gate 76 is turned to an "L" level and the output of NAND gate 72 is held at an "H" level. At the same time, the output of NAND gate 73 is turned to an "H" level and internal address signal intAl2 is turned to an "H" level (1).

In the normal operation, signals RA12FL and RF12FH are both turned to an "L" level. Then, the output of NOR gate 76 is turned to an "H" level, the output of NAND gate 73 is turned to an "H" level, and external address signal A12 is delayed by buffer circuit 71, NAND gates 72 and 74 and inverter 75 and turned to internal address signal intAl2.

As 256-M SDRAM can be set to the test board for 64-M SDRAM to test all the addresses, test cost can be reduced by the utilization of an existing test board.

Figure 13:
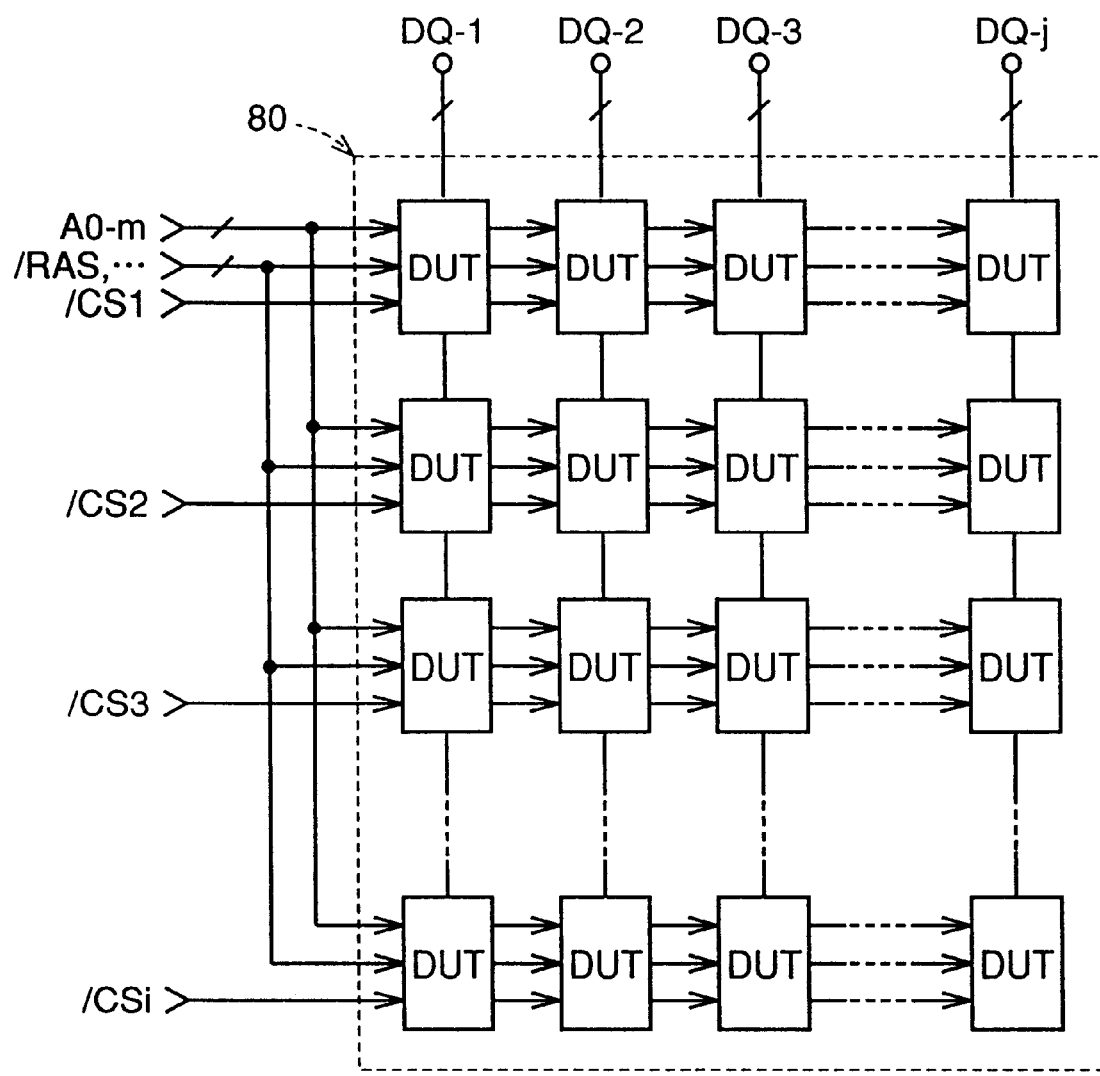
FIG. 13 is a block diagram showing a structure of a test board for testing an SDRAM to be described with reference to FIG. 12.

FIG. 13 is a block diagram showing a test board 80. In FIG. 13, i×j (here i and j are integers at least 1) devices to be tested (hereinafter referred to as DUT: Device Under Test) are placed, that is, SDRAMs are arranged as a matrix of i rows by j columns on test board 80. Address signals A0–Am commonly are supplied to all DUTs. Control signals/RAS, /WE and so on other than signal/CS are commonly supplied to all DUTs. Signals/CS1-/CSi are supplied to DUTs of first row to ith row, respectively. Here, data input/output terminals of i DUTs of every column are connected in common. Test board 80 is connected to a tester (not shown) and a number of DUTs are tested by a single tester.

Fifth Embodiment

When test is performed with test board 80 shown in FIG. 13, data writing can be performed simultaneously for all DUTs on board 80. Data reading, however, must be performed separately for every row. If data of all DUTs are simultaneously read, read data from the first DUT and read data from the second DUT collide and correct data reading will be obstructed. Therefore, while data in DUT of a certain row is being read, data of DUT in other rows must be held. With regard to DUTs in other rows, self refresh operation can be performed. At the time of the test on test board 80, however, the capability of self refresh of each DUT has not been determined. In the fifth embodiment, this problem will be solved.

Figure 14:
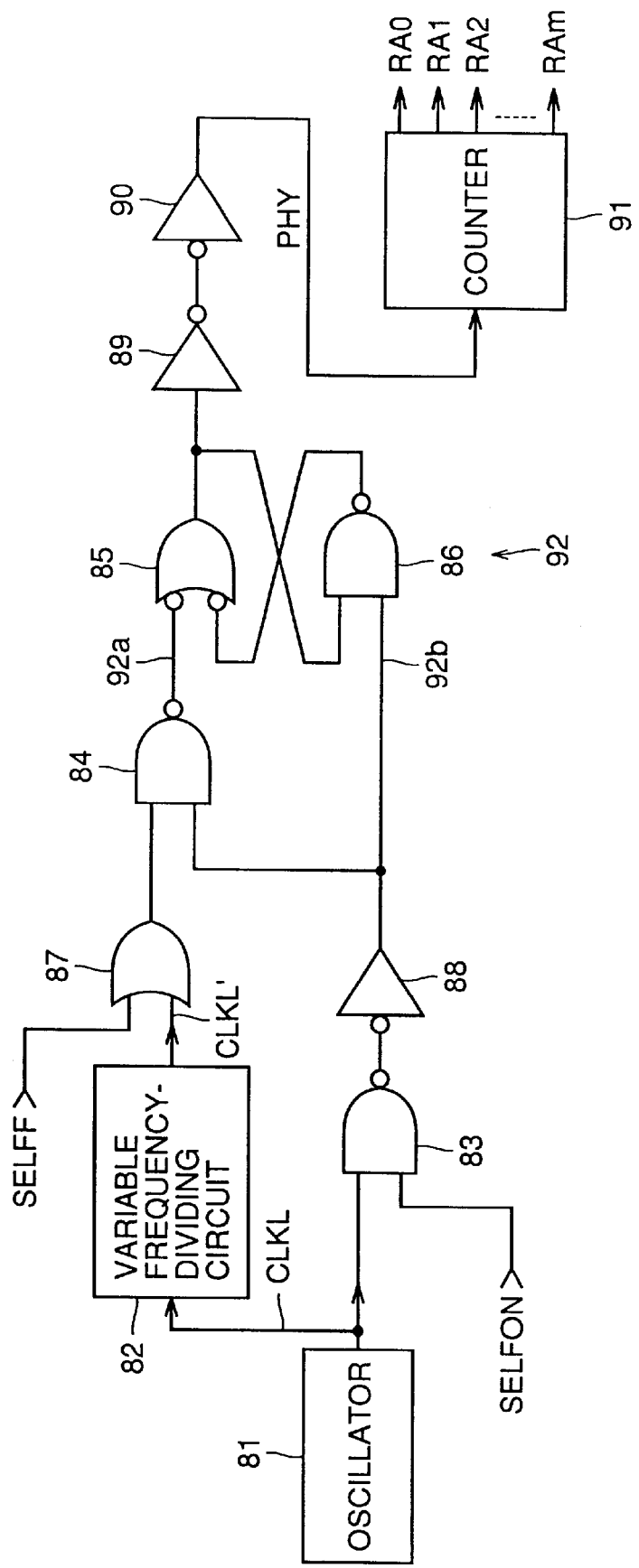
FIG. 14 is a circuit block diagram showing a main portion of an SDRAM according to a fifth embodiment of the present invention.

FIG. 14 is a circuit block diagram showing a main portion of an SDRAM according to the fifth embodiment of the present invention. In FIG. 14, the SDRAM includes an oscillator 81, a variable frequency-dividing circuit 82, NAND gates 83–86, an OR gate 87, inverters 88–90 and a counter 91, and NAND gates 85 and 86 constitute a flip flop 92.

Oscillator 81 generates and supplies a standard clock signal CLKL having a cycle of $\alpha \mu s$ to variable frequency-dividing circuit 82 and one input node of NAND gate 83. Variable frequency-dividing circuit 82 frequency divides standard clock signal CLYL, generates a clock signal CLKL' having a cycle K (here K is an integer at least 1) times as long as the cycle of standard clock signal CLKL and supplies the resulting signal to one input node of OR gate 87. The frequency dividing ratio K of variable frequency-dividing circuit 82 can be set to a desired value. Signals SELFON, SELFF are supplied to NAND gate 83 and another input node of OR gate 87, respectively. Signal SELFON is a signal generated in response to the self refresh command and signal SELFF is one type of test signal TMSIG.

An output signal of NAND gate 83 is input to a reset terminal 92b of flip flop 92 via inverter 88. NAND gate 84 receives output signals of inverter 88 and OR gate 87 and the output thereof is input to a set terminal 92a of flip flop 92. An output signal of flip flop 92 is delayed by inverters 89 and 90 and turned to a signal PHY. Counter 91 counts the number of rises of signal PHY. Here, m+1 output signals from counter 91 are employed as row address signals RA0–RAm. At the time of self refresh, output signals RA0–RAm from counter 91 are supplied to row decoder 11 instead of row address signals RA0–RAm generated in accordance with external address signals A0–Am.

In the normal operation, signals SELFON, SELFF both attain an "L" level, and signal PHY is held at an "L" level. At the time of normal self refresh, signals SELFON, SELFF attain an "H" level and an "L" level, respectively, output clock signal CLKL of oscillator 81 is supplied to reset terminal 92b of flip flop 92 and a complementary signal of a logical product signal of standard clock signal CLKL and output clock signal CLKL' of variable frequency-dividing circuit 82 is supplied to set terminal 92a of flip flop 92. Hence, the cycle of signal PHY becomes equal to the cycle of clock signal CLKL'. Frequency-dividing ratio K of variable frequency-dividing circuit 82 is set according to data holding capability of each SDRAM. When data holding capability of SDRAM is low, refresh must be performed at a short cycle, and frequency-dividing ratio K is set to be low. When data holding capability of SDRAM is high, refresh can be performed at a long cycle, and frequency-dividing ratio K is set to be high.

At the time of testing with above mentioned test board 80, test of data holding capability of each SDRAM has not been performed. And the capability concerning refresh has not been determined. Here, when test is performed with test board 80, signals SELFON, SELFF are both turned to an "H" level. Then, the output of OR gate 87 is held at an "H"

level and standard clock signal CLKL is supplied to reset terminal 92b of flip flop 92 and complementary signal thereof /CLKL is supplied to set terminal 92a. Hence, the cycle of signal PHY becomes equal to the cycle of standard clock signal CLKL and the refresh is performed at a minimum cycle $\alpha\mu s$.

Thus, even when the capability of self refresh of each SDRAM has not been determined, a number of SDRAMs can be tested with test board 80 and the efficient test operation can be achieved with reduced cost.

Sixth Embodiment

Conventionally, a disturb test has been performed in the SDRAM in which each word line WL is successively driven for a predetermined time period and the degree of interference between each word line WL and an adjacent word line WL is tested. As the disturb test requires long time operation, reduction of test cost is attempted by performing the test simultaneously for a set of SDRAMs on test board 80. To drive one word line WL, three command inputs, that is, active, write (or read) and precharge, are necessary. In the test using test board 80, rapid input of these commands cannot be achieved because load on the tester becomes large. Hence, the test time becomes long. In the sixth embodiment, this problem will be solved.

Figure 15:
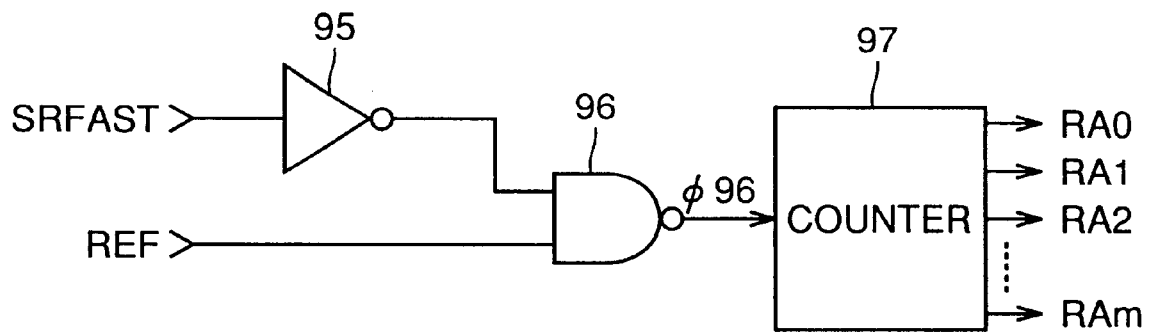
FIG. 15 is a circuit block diagram showing a main portion of an SDRAM according to a sixth embodiment of the present invention.

FIG. 15 is a circuit block diagram showing a main portion of an SDRAM according to the sixth embodiment of the present invention. In FIG. 15, SDRAM includes an inverter 95, an NAND gate 96 and a counter 97. A signal SRFAST is supplied to one input node of NAND gate 96 via inverter 95. A signal REF is supplied to another input node of NAND gate 96. Signal SRFAST is a signal attaining an "H" level at the time of TBI self disturb implemented in this embodiment and attaining an "L" level during other time period. Signal SRFAST is one type of test signal TMSIG. Signal REF attains an "H" level in a pulse form whenever auto refresh is designated. Counter 97 counts the number of rises of output signal φ96 of NAND gate 96 and outputs row address signals RA0–RAm. Output signals RA0–RAm of counter 97 are supplied to row decoder 11 instead of row address signals RA0–RAm generated according to external address signals A0–Am at the time of auto refresh and TBI self disturb.

When signal SRFAST is at an "H" level, an output signal of NAND gate 96 is held at an "H" level. Therefore, during the period where signal SRFAST is at an "H" level, even if signal REF oscillates, same word line WL is selected. When signal SRFAST is at an "L" level, signal REF is input to counter 97 via NAND gate 96. Therefore, a different word line WL is selected every time signal REF falls.

Figure 16:
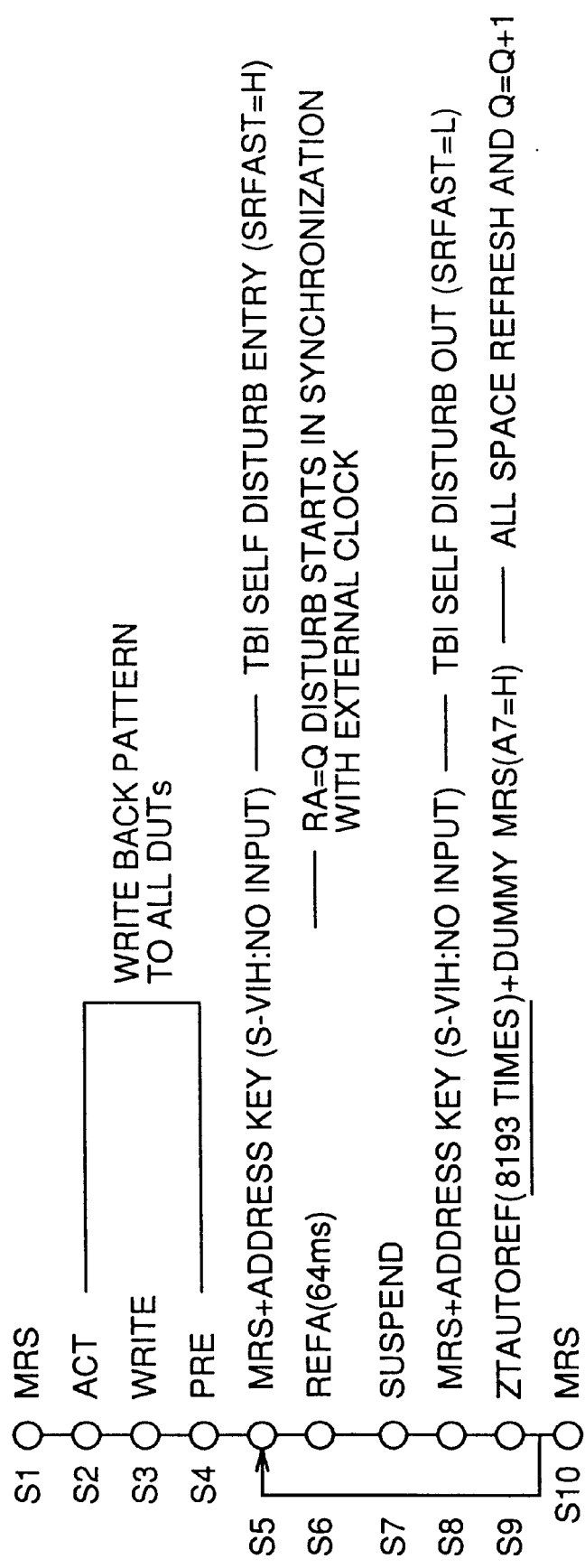
FIG. 16 is a flow chart shown to describe a TBI self disturb mode performed in an SDRAM to be described with reference to FIG. 15.
Figure 17:
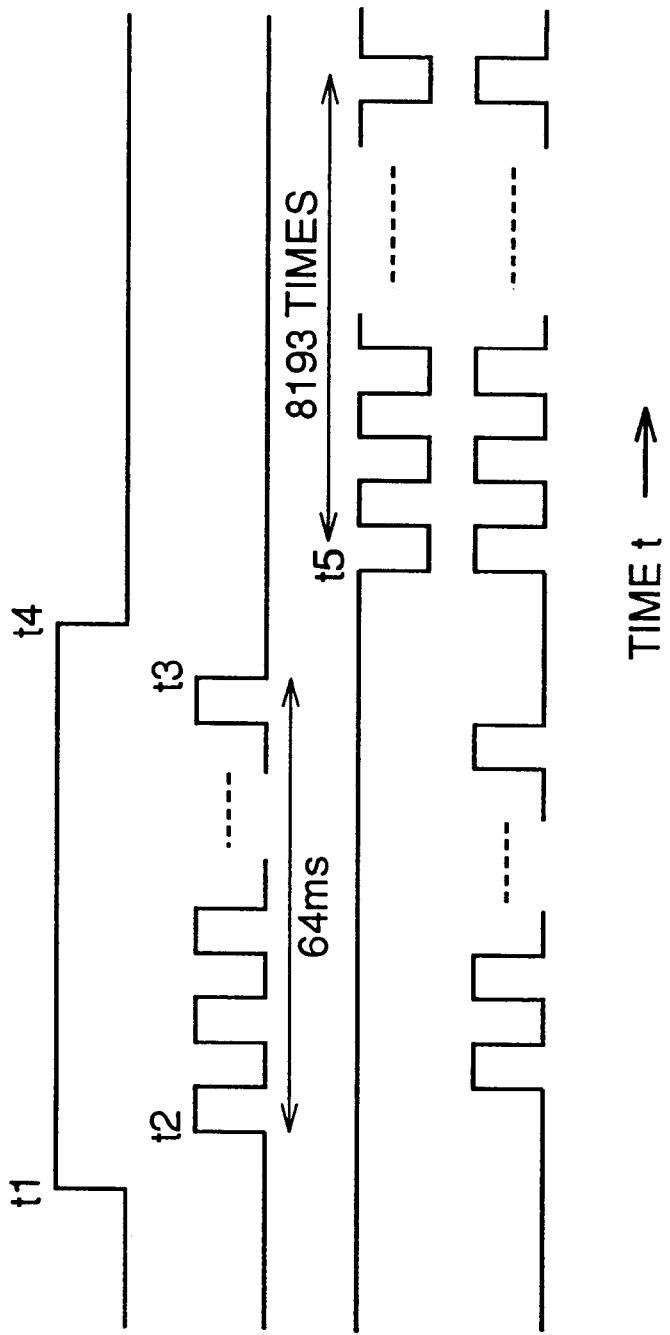
FIGS. 17A to 17D are time charts shown to describe a TBI self disturb mode of FIG. 16.

FIG. 16 is a flow chart of the test operation, and FIGS. 17A–17D are time charts thereof. At step S1 mode register set command MRS (/CS=L, /RAS=L, /CAS=L, /WE=L) is supplied as an input, at step S2 an active command ACT (/CS=L, /RAS=L, /CAS=H, /WE=H) is supplied as an input, at step S3 a write command WRITE (/CS=L, /RAS=H, /CAS=L, /WE=L) is supplied as an input, and at step S4, precharge command PRE (/CS=L, /RAS=L, /CAS=H, /WE=L) is supplied as an input, and back pattern data is written into a memory space of all DUTs on board 80.

At step S5, mode register set command MRS and predetermined address key (no input of S-VIH) are input and TBI self disturb mode is entered. At the entry of TBI self disturb mode, signal SRFAST is turned to an activation level, that is, an "H" level (time t1). At step S6, auto refresh command REFA (/CS=L, /RAS=L, /CAS=L, /WE=H) is input in synchronization with external clock signal CLK (time t2 to t3). Though signal REF oscillates in response to auto refresh command REFA, count value RA=Q of counter 97 does not change because signal SRFAST is at an "H" level and the same word line WL is repeatedly turned to an "H" level, that is a select level. Here, when the interference between word lines WLs is strong, data in memory cell MC connected to a word line WL adjacent to the selected word line WL will be damaged.

After 200 ns of suspension at step S7, through the input of mode register set command MRS and a predetermined address key (no input of S-VIH), TBI self refresh mode exit is performed at step S8. At the exit from TBI self refresh mode, signal SRFAST is turned to an "L" level, that is an inactivation level (time t4).

At step S9, a signal ZTAUTOREF, which is one type of test signal TMSIG, is turned to an "L" level for 8193 times in synchronization with external clock signal CLK. When signal ZTAUTOREF attains an "L" level, signal REF is turned to an "H" level, word line WL designated by output signals RA0–RAm of counter 97 is turned to an "H" level for a predetermined time period and re-writing of data to memory cell MC connected to this word line WL is performed. As 256-M SDRAM has 8192 word lines WLs, when signal ZTAUTOREF is turned to an "L" level for 8193 times, data in all memory space of the SDRAM is refreshed and the counter value RA=Q of counter 97 is turned to Q+1. The disturb test for one SDRAM is finished when steps S1–S9 are performed for all word lines WLs. In step S0, disturb test is finished with the input of mode register set command MRS.

In the sixth embodiment, as the disturb test is performed utilizing auto refresh function of each SDRAM, disturb test can be performed rapidly compared with a conventional case where disturb test is performed with input of three commands, that is, active, write (or read) and precharge, from a tester to the SDRAM.

Seventh Embodiment

When a number of DUTs are set on a single test board 80 and tested, the current consumption sometimes increases beyond the capacity of a tester connected to test board 80. Such problem can be settled by dividing a plurality of DUTs on board 80 into a plurality of blocks (two, for example) and performing the test twice. However, as signals such as control signals (except signals/CS1-/CSi) are commonly given to all DUTs on board 80, test cannot be performed simply as a set of two distinct tests. In the seventh embodiment, this problem will be solved.

Figure 18:
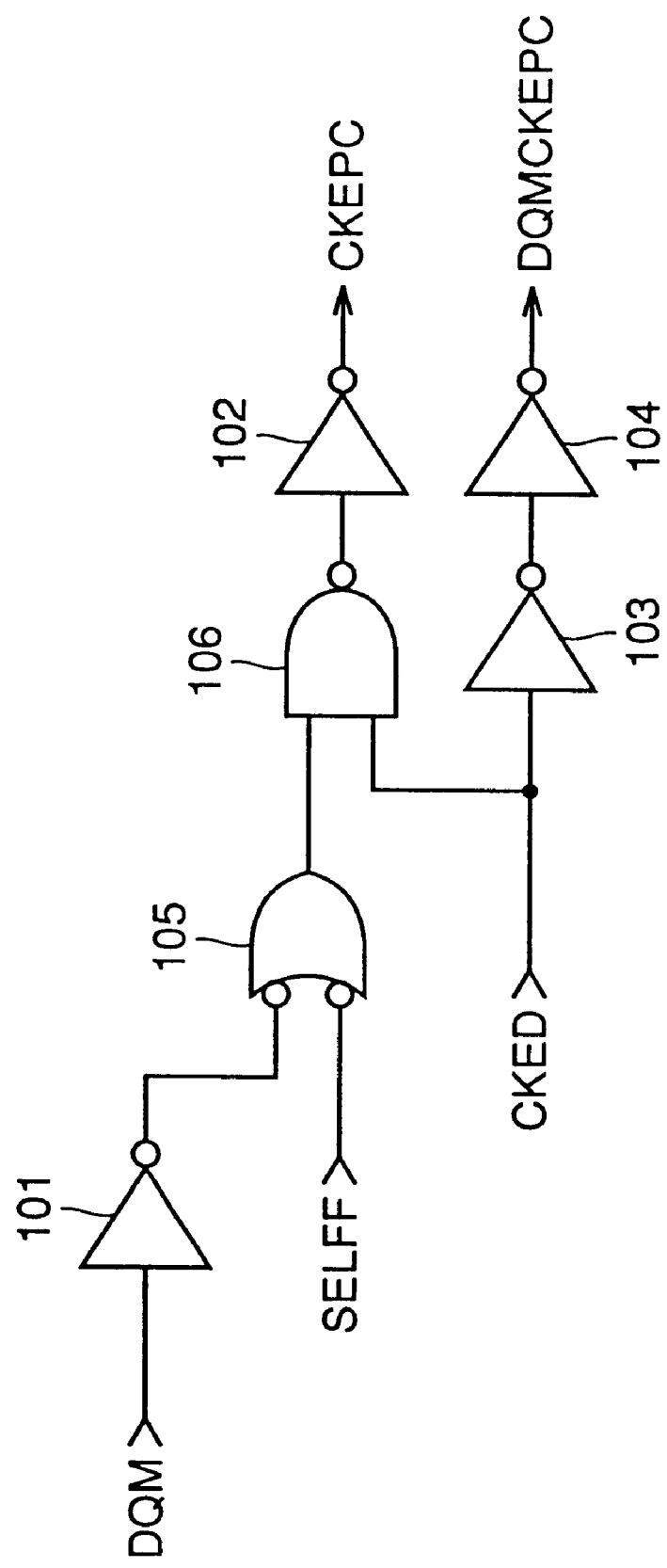
FIG. 18 is a circuit diagram showing a main portion of an SDRAM according to a seventh embodiment of the present invention.

FIG. 18 is a circuit diagram showing a main portion of an SDRAM according to the seventh embodiment of the present invention. In FIG. 18, the SDRAM includes inverters 101–104 and NAND gates 105 and 106. A signal DQM is supplied to inverter 101. NAND gate 105 receives an output signal of inverter 101 and signal SELFF and supplies an output to one input node of NAND gate 106. A delayed signal CKED of external control signal CKE is given to another input node of NAND gate 106 and at the same time, is delayed by inverters 103 and 104 and turned to a signal DQMCKEPC. An output signal of NAND gate 106 is inverted by inverter 102 and turned to a signal CKEPC.

When signal DQM is at an "H" level and/or signal SELFF is at an "L" level, an output of NAND gate 105 is turned to an "H" level and then signal CKED attains an "H" level. Then signals CKEPC and DQMCKEPC both attain an "H" level. When signals CKEPC and DQMCKEPC both attain an "H" level, input buffers for all external signals are activated whereby the SDRAM accepts all external signals.

When signal DQM is at an "L" level and signal SELFF is at an "H" level, an output of NAND gate 105 is turned to an "L" level and then signal CKEPC is held at an "L" level. Then, when signal CKED attains an "H" level, signal DQMCKEPC attains an "H" level. In this case, input buffers for external signals other than an input buffer for signal DQM is inactivated. Then, the SDRAM turns not to accept external signals other than signal DQM, and the SDRAM does not accept various command inputs and entry of TBI self refresh mode.

Figure 19:
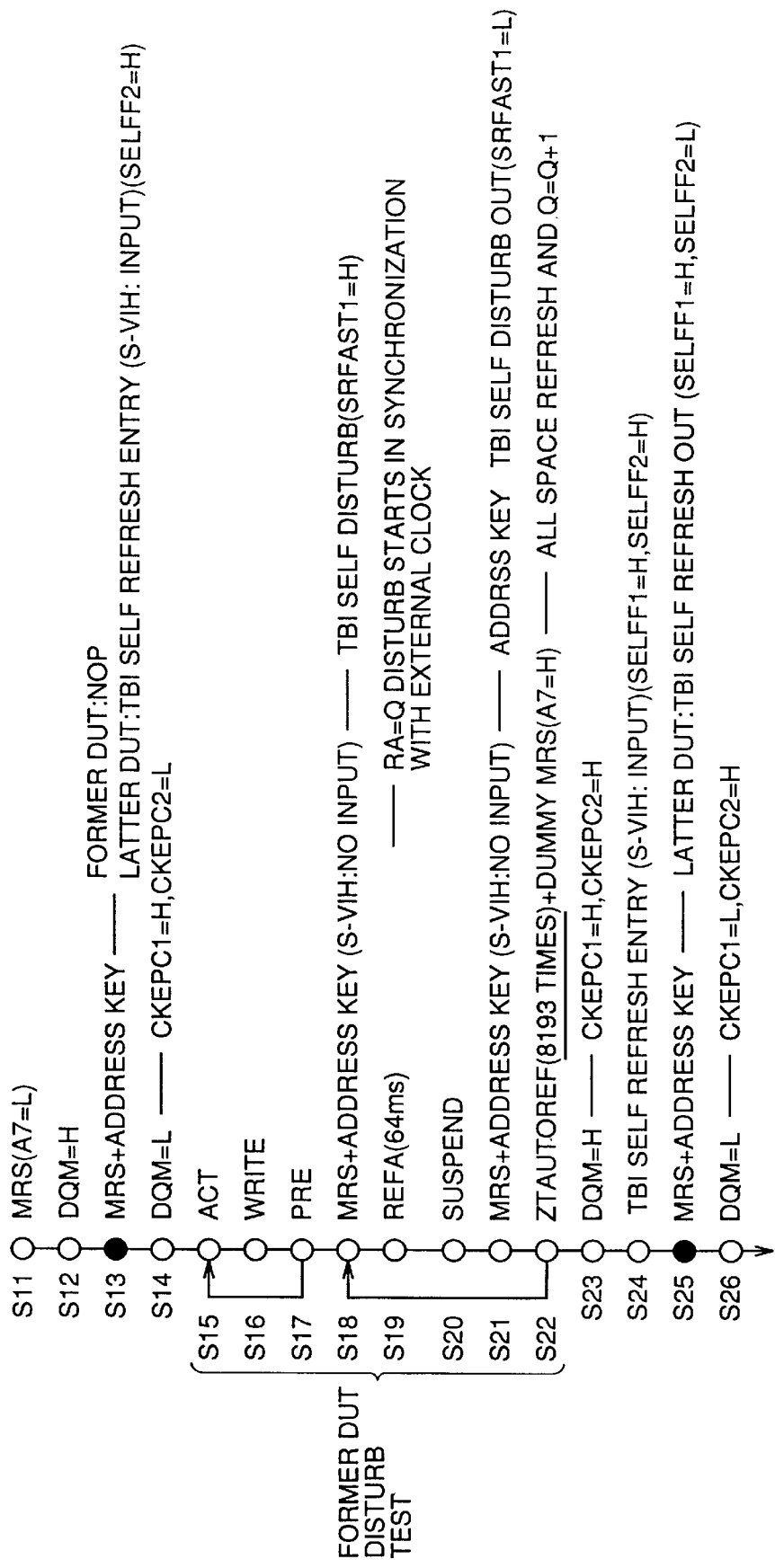
FIG. 19 is a flow chart showing a first half of a test performed in an SDRAM to be described with reference to FIG. 18.
Figure 20:
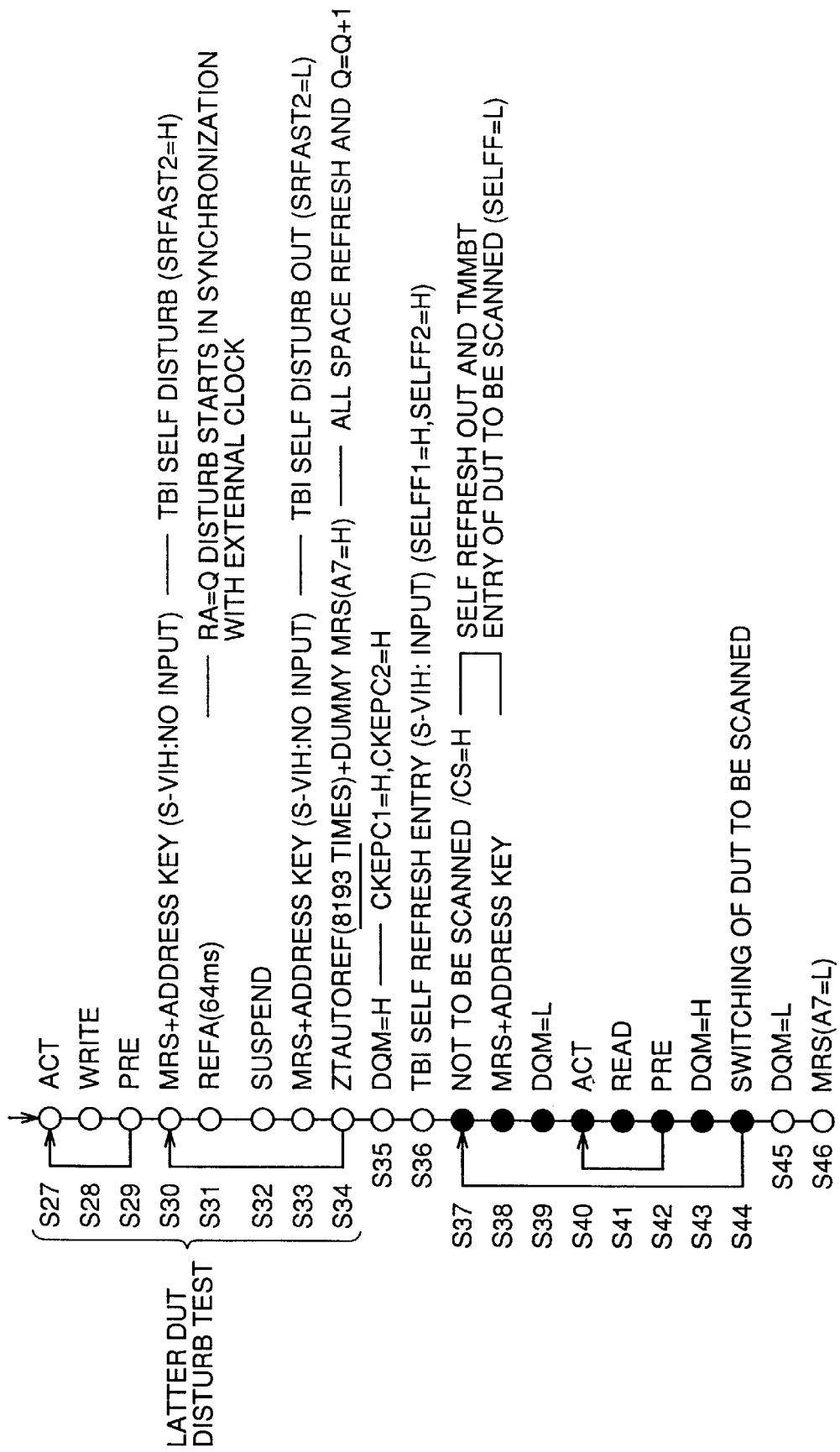
FIG. 20 is a flow chart showing a latter half of a test performed in an SDRAM to be described with reference to FIG. 18.

FIGS. 19 and 20 are flow charts of a test operation, and FIGS. 21A–21H are timing charts thereof. Here, devices in i rows on board 80 are divided to two portions, and DUTs of first to kth rows are referred to as former DUTs and DUTs of k+1ith to ith rows are referred to as latter DUTs.

First, at step S11, mode register set command MRS (A7=L) is supplied as an input. Then at step S12, signal DQM is turned to an "H" level (time t1), and at step S13 signals/CS1-/CSk are turned to an inactivation level "H" level and former DUTs are turned to an NOP state, while latter DUTs are made to enter TBI self refresh mode through the inputs of mode register set command MRS and a predetermined address key. When latter DUTs enter TBI self refresh mode, signal SELFF2 of latter DUTs attains an "H" level (time t2).

At step S14, signal DQM is turned to an "L" level (time t3) and signal CKEPC2 of latter DUTs attains an "L" level and latter DUTs become unable to accept signals other than signal DQM. Therefore, latter DUTs are cut off from the external effect and continues self refresh operation entered at step S13. As the self refresh is performed at a low current consumption, the load on the tester is small. On the other hand, as signal CKEPC1 attains an "H" level for former DUTs, a desired test can be performed for former DUTs. In FIG. 19, a disturb test is performed from steps S15–S22 (time t4–t6).

At step S23, signal DQM is turned to an "H" level (time t7), and signals CKEPC1 and CKEPC2 both attain an "H" level and latter DUTs come to accept external signals. At step S24, all DUTs on board 80 enter TBI self refresh mode (time t8). At step S25, through the input of mode register set command MRS and predetermined address key, latter DUTs exit TBI self refresh mode (time t9).

At step S26, signal DQM is turned to an "L" level (time t10), signal CKEPC1 of former DUTs are turned to an "L" level and former DUTs come not to accept the signals other than signal DQM. Therefore, former DUTs are cut off from the external input and continue self refresh operation entered at step S24. As the self refresh is performed with a low current consumption, the load on the tester is small. On the other hand, as signal CKEPC2 for latter DUTs is at an "H" level, a desired test can be performed for latter DUTs. In FIG. 20, a disturb test is performed from steps S27–S34 (time t11–t13).

When signal DQM attains an "H" level at step S35 (time t14), signals CKEPC1 and CKEPC2 both attain an "H" level and former DUTs come to accept external signals. At step S36, all DUTs on board 80 enter TBI self refresh mode (time t15).

Thereafter, data in the plurality of DUTs on board 80 are read row by row (time t16–). At step S37, signal/CS not to be scanned is held at an "H" level, at step S38, mode register set command MRS and predetermined address key are input, DUTs to be scanned exit TBI self refresh mode and DUT to be scanned enters TMMBT mode. At step S39, signal DQM attains an "L" level, at step S40 active command ACT is supplied, at step S41 read command READ is supplied, at step S42 precharge command PRE is input, at step S43, signal DQM is turned to an "H" level and at step S44 row of DUT to be scanned is switched. By repeating the steps from S37 to S44, data in all DUTs on board 80 are read.

At step S45, signal DQM is turned to an "L" level, mode register set command MRS is supplied and test ends. A DUT for which the same data with write data is read is determined to be normal, and a DUT for which data different from the write data is read is determined to be defective.

In the seventh embodiment, a plurality of DUTs on board 80 can be tested by performing the test two times. Thus, the existing tester and board 80 can be utilized and test cost can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a semiconductor substrate having a plurality of test modes, comprising:

a plurality of memory cells arranged like a matrix;

a plurality of signal transmission lines for transmitting first to Mth (where M is an integer at least 2) address signals and a test mode entry signal;

a select circuit selecting a memory cell among said plurality of memory cells according to first to Mth address signals supplied via said plurality of signal transmission lines;

a read/write circuit reading/writing data from/to the memory cell selected by said select circuit;

a plurality of test circuits dispersedly provided on said semiconductor substrate for performing said plurality of test modes; and a signal generation circuit provided in a proximity of each corresponding test circuit for supplying a test signal to the corresponding test circuit to perform a corresponding test mode in response to the supply of N (where N is an integer at least 1 and at most M) address signals corresponding to the corresponding test mode among said first to Mth address signals and said test mode entry signal through said plurality of signal transmission lines.

2. The semiconductor memory device according to claim 1, wherein said plurality of memory cells are divided into a plurality of memory arrays; and said semiconductor memory device allows selective setting of a specification among a plurality of different specifications, and further comprises:

signal input terminals for receiving memory array select signals respectively, a memory array select circuit for selecting a memory array among said plurality of memory arrays according to said memory array select signals, and a test mode entry circuit supplying the test mode entry signal to make said semiconductor memory device enter the test mode in response to supply of a voltage higher than a power supply voltage to a predetermined terminal of said signal input terminals according to the specification of said semiconductor memory device.

3. The semiconductor memory device according to claim 1, wherein said semiconductor memory device receives a plurality of external address signals associated with said first to Mth address signals, and said plurality of test modes are performed without using a part of the plurality of external address signals.

* * * * *